United States Patent
Sato et al.

(10) Patent No.: US 7,396,885 B2
(45) Date of Patent: *Jul. 8, 2008

(54) PHOTO-SETTING AND THERMOSETTING RESIN COMPOSITION, PROCESS FOR PREPARING PLUGGED-THROUGH-HOLE PRINTED WIRING BOARD AND PLUGGED-THROUGH-HOLE PRINTED WIRING BOARD

(75) Inventors: Kiyoshi Sato, Tokyo (JP); Kazunori Kitamura, Tokyo (JP)

(73) Assignee: SAN-EI Kagaku Co., Ltd. (JP)

( * ) Notice: Subject to any disclaimer, the term of this patent is extended or adjusted under 35 U.S.C. 154(b) by 3 days.

This patent is subject to a terminal disclaimer.

(21) Appl. No.: 10/241,459

(22) Filed: Sep. 12, 2002

(65) Prior Publication Data
US 2003/0215567 A1 Nov. 20, 2003

(30) Foreign Application Priority Data
Sep. 27, 2001 (JP) .............................. 2001-337180

(51) Int. Cl.
*C08L 63/10* (2006.01)
(52) U.S. Cl. ...................... 525/486; 525/524
(58) Field of Classification Search ................. 430/269, 430/280.1, 286.1, 311, 315; 525/485, 486, 525/524, 525, 526
See application file for complete search history.

(56) References Cited

U.S. PATENT DOCUMENTS

| | | | | |
|---|---|---|---|---|
| 4,072,592 A | * | 2/1978 | Due et al. ................... 428/418 |
| 4,371,566 A | * | 2/1983 | Russell ........................ 427/512 |
| 4,900,763 A | * | 2/1990 | Kraushaar ..................... 522/14 |
| 4,954,304 A | * | 9/1990 | Ohtake et al. ................ 264/137 |
| 5,055,378 A | * | 10/1991 | Miyamura et al. ........ 430/280.1 |
| 5,204,379 A | * | 4/1993 | Kubota et al. ................. 522/96 |
| 6,475,701 B2 | * | 11/2002 | Ohno et al. .............. 430/280.1 |
| 6,812,299 B2 | * | 11/2004 | Sato et al. .................... 525/486 |

FOREIGN PATENT DOCUMENTS

| JP | 10887 | * | 2/1975 |
|---|---|---|---|
| JP | 63-154780 | * | 6/1988 |
| JP | 63154780 | * | 6/1988 |
| JP | 09-071637 | * | 3/1997 |
| JP | 2001181482 | * | 7/2001 |
| JP | 2001-181482 | * | 7/2004 |

* cited by examiner

*Primary Examiner*—Brian K Talbot
(74) *Attorney, Agent, or Firm*—H. Jay Spiegel; Robert L. Haines

(57) ABSTRACT

A photo-setting and thermosetting resin composition comprises (I) a partial adduct of epoxy resin with unsaturated aliphatic acid, (II) (meth)acrylates, (III) a photocrosslinking agent, (IV) liquid epoxy resin, and (V) a latent curing agent. The resin composition can be easily charged and plugged into a through-hole, does not drip down, and can be effectively photo-set and thermoset. A photo-set product prepared of the resin composition can be easily polished. A plugged-through-hole printed wiring (substrate) board prepared of the resin composition does not cause defects such as hollows, cracks, blisters, peelings and so on, is excellent in solder-resistance, does not corrode a metal part, and can produce an appliance of high reliability and long life which does not occur short circuit and poor electrical connection.

1 Claim, 3 Drawing Sheets

PHOTO-SETTING AND THERMOSETTING RESIN COMPOSITION, PROCESS FOR PREPARING PLUGGED-THROUGH-HOLE PRINTED WIRING BOARD AND PLUGGED-THROUGH-HOLE PRINTED WIRING BOARD

BACKGROUND OF THE INVENTION

1. Field of the Invention

The present invention generally relates to a photo-setting and thermosetting resin composition, and a process for preparing a plugged-through-hole double- or single-sided printed wiring board and a plugged-through-hole multi-layer printed wiring substrate (hereinafter sometimes referred to as "a plugged-through-hole printed wiring (substrate) board") as well as a plugged-through-hole printed wiring (substrate) board.

More particularly, the present invention relates to a photo-setting and thermosetting resin composition suitable for a plugging material for a through-hole of a double- or single-sided printed wiring board and multi-layer printed wiring substrate, a process for preparing a double- or single-sided printed wiring board and multi-layer printed wiring substrate the through-hole in which is plugged with the resin composition and a plugged-through-hole printed wiring (substrate) board prepared by the process for preparing.

2. Discussion of Background

In a conventional method of a printed wiring board, a through-hole has been temporarily plugged with a set resin, then has been subjected to an etching treatment to form a conductor circuit, thereafter a set resin has been dissolved and removed together with an etching resist by an etching resist removing liquid to expose again the through-hole.

However, if a through-hole exists in a printed wiring board, a solder flows into the through-hole and reaches an opposite surface of the printed wiring board when mounting parts such as an IC chip and so on are connected to the printed wiring board by soldering. As a result, there has been a problem that a short occurs. Further, there has been a problem that since a solder flows into the through-hole, an amount of solder required for connecting the parts lowers to cause poor connection.

Furthermore, if there exists a through-hole in a printed wiring board, when printing is made on both sides of the printed wiring board with a solder resist agent, a through-hole of the surface of the printed wiring board on which printing has been made previously is plugged in the shape of a tent with a solder resist agent; and hence the way of escape of air in the through-hole disappears when printing is made later on the opposite surface of the printed wiring board. As a result, air space sometimes remains in the through-hole. If the printed wiring board is treated with chemicals in a subsequent process under the state remained unchanged, the chemicals flow into the air space and remains therein because cleaning inside the air space can not be carried out sufficiently. As a result, there has been a problem that metal parts of the printed wiring board such as a copper-clad part, a plated part and so on corrode.

Therefore, in recent years the so-called "permanent through-hole plugging" has been carried out in which only an etching resist is removed and a set resin plugged into the through-hole is not removed. A thermosetting resin composition, which is set to form a set resin non-soluble in an etching resist removing liquid, is used as the permanent through-hole plugging material.

However, such a conventional thermosetting resin composition contains a great deal of solvent. Therefore, a great deal of solvent is evaporated when the thermosetting resin composition is thermoset and the volume of the thermosetting resin composition is shrunk sharply. As a result, the liquid level of the resin composition ((16) in FIG. 3 or (19) in FIG. 4) plugged into the through-hole of the substrate ((15) in FIG. 3 or (17) in FIG. 4) lowers; and hence a big hollow is formed or cracks are formed inside the set resin ((18) in FIG. 4).

Accordingly, when the set resin is further treated with chemicals in a subsequent process, the chemicals remain in the hollow. And sometimes the cracks inside the set resin are lengthened to the surface of the through-hole due to thermal hysteresis of the subsequent processes such as soldering and so on and the chemicals soak into inside the set resin from the cracks on the surface. These decrease the reliability or lifetime of an appliance.

Therefore, a two-stage-type thermosetting resin composition has been used as the through-hole plugging material. When the two-stage-type thermosetting resin composition is used, the primary setting is carried out at relatively low temperatures at which evaporation of solvent does not so occur to harden the shape of the resin to a certain extent and subsequently the secondary setting is carried out at high temperatures.

However, there has been a problem that while the resin composition present on the surface of the substrate among the resin compositions charged and plugged into the through-hole can be primary set at low temperatures, the resin composition present in the central region of the substrate can not be primary set sufficiently at low temperatures. In this case, if the resin composition present in the central region of the substrate is set sufficiently, the setting reaction of the resin composition present in the surface of the substrate proceeds and the hardness of the set product become hard excessively. As a result, there has been a problem that precise polishing of the surface of the substrate at a subsequent process is hard to carry out.

Therefore, in recent years a resin composition having both photo-setting and thermosetting properties (photo-primary setting+thermo-secondary setting) has been proposed instead of the above-described thermosetting resin composition which is set only by heating.

For example, JP Patent Laid-Open Publication No. 8-73565, JP Patent Laid-Open Publication No. 8-157566, JP Patent Laid-Open Publication No. 8-269172, JP Patent Laid-Open Publication No.9-107183, and JP Patent Laid-Open Publication No. 11-147285 describe a photo-setting and thermosetting resin composition.

However, each of the thermosetting resin compositions described in these publications contains epoxy rein which is solid at an ordinary temperature. When such epoxy rein is melted by heating, its viscosity generally lowers significantly. And hence, when the thermosetting resin composition plugged into the through-hole of the substrate ((20) in FIG. 5) is set by heat-setting, there is a problem that the viscosity of the thermosetting resin composition ((21) in FIG. 5) lowers and causes drips. And, when epoxy rein exists in the resin composition, there is a problem that when the resin composition is irradiated with light, light transmission is prevented due to the presence of the epoxy resin and hence effective photo-setting can not be carrier out.

JP Patent Laid-Open Publication No. 10-245431 describes a photo-setting and thermosetting sealer comprising epoxy resin, a photo-setting compound [(meta) acrylate compound and so on], a radical-generating agent and a latent curing agent.

However, in the case of the sealer, there is a problem that unset portions remain in the sealer because the setting properties of the photo-set product are not sufficient. As a result, the precise polishing of the surface of the printed wiring board in the subsequent process is hard to carry out; and hence there is a problem that a sufficient smooth surface of the substrate can not be obtained. Further, a problem occurs in chargeability and applicability of the sealer into the through-hole.

U.S. Pat. No. 2,598,346 gazette describes a photo-setting and thermosetting resin composition comprising an adduct of epoxy rein with 100% (meth) acrylic acid, a (meta) acrylate compound, a photopolymerization initiator, a thermosetting resin (bisphenol A-type resin and so on) and a curing agent (imidazole compound).

However, in the case of the resin composition, there is a problem that a photo-set product becomes hard excessively in contrast with the case of above-described sealer. Also in that case, the precise polishing of the surface of the printed wiring board in the subsequent process is hard to carry out and a sufficient smoothness cannot be obtained. As a result, there is a problem that the solder-resistance of the plugged-through-hole printed wiring board obtained is not sufficient.

U.S. Pat. No. 2,571,800 gazette describes a photo-setting and thermosetting adhesive comprising a (meth) acrylic-modified epoxy resin, an ethylene-series polymerizable compound [(meth) acrylate compound and so on], a photoradical initiator, and an epoxy curing agent (imidazole compound and so on.).

However, in the case of the adhesive, there is a case that heat-resistance is not sufficient. And hence, there is a problem that the solder-resistance of the plugged-through-hole printed wiring board prepared therefrom is not sufficient.

SUMMARY OF THE INVENTION

An object of the present invention is to provide a photo-setting and thermosetting resin composition which can be easily charged and plugged into a through-hole, which does not drip, which can be effectively photo-set and thermoset, and which is photo-set to form a photo-set product easily polished.

Another object of the present invention is to provide a plugged-through-hole printed wiring board in a set resin plugged into the through-hole of which a hollow or a crack is not formed, which is excellent in solder-resistance, a metal part of which does not corrode, and hence which can produce an appliance having high reliability and long life without short circuit or poor electrical connection.

In order to achieve the above-described objects, the present inventors have studied devotedly and accomplished the present invention described below.

According to the present invention, there is provided a photo-setting and thermosetting resin composition comprising (I) a partial adduct of epoxy resin with unsaturated aliphatic acid, (II) (meth)acrylates, (III) a photocrosslinking agent, (TV) liquid epoxy resin, and (V) a latent curing agent.

According to the present invention, there is provided a process for preparing a plugged-through-hole double- or single-sided printed wiring board comprising the steps of:

plugging the above-described photo-setting and thermosetting resin composition into a through-hole of the double- or single-sided printed wiring substrate;

carrying out photo-setting to form a photo-set product;

polishing a surface of the substrate;

(A) thermosetting the photo-set product and forming a conductor circuit; or (B) forming the conductor circuit and thermosetting the photo-set product.

According to the present invention, there is provided a process for preparing a plugged-through-hole multi-layer printed wiring substrate, comprising the steps of:

plugging the above-described photo-setting and thermosetting resin composition into a through-hole of the multi-layer printed wiring substrate;

carrying out photo-setting to form a photo-set product;

polishing a surface of the substrate;

(A) thermosetting the photo-set product and forming a conductor circuit; or (B) forming the conductor circuit and thermosetting the photo-set product.

According to the present invention, there is provided a process for preparing a plugged-through-hole multi-layer printed wiring substrate, comprising the steps of:

plugging the above-described photo-setting and thermosetting resin composition into a through-hole of the multi-layer printed wiring substrate;

carrying out photo-setting to form a photo-set product;

polishing a surface of the substrate;

applying plating on the surface of the substrate;

(A) thermosetting the photo-set product and forming a conductor circuit; or (B) forming the conductor circuit and thermosetting the photo-set product.

According to the present invention, there is provided a plugged-through-hole double- or single-sided printed wiring board and a plugged-through-hole multi-layer printed wiring substrate prepared by any one of processes described above.

BRIEF DESCRIPTION OF THE DRAWINGS

A more complete understanding of the present invention may be had with reference to the following detailed explanations that are given in connection with the accompanying drawings, in which.

DETAILED DESCRIPTION OF THE PREFERRED EMBODIMENTS

Figure 1:
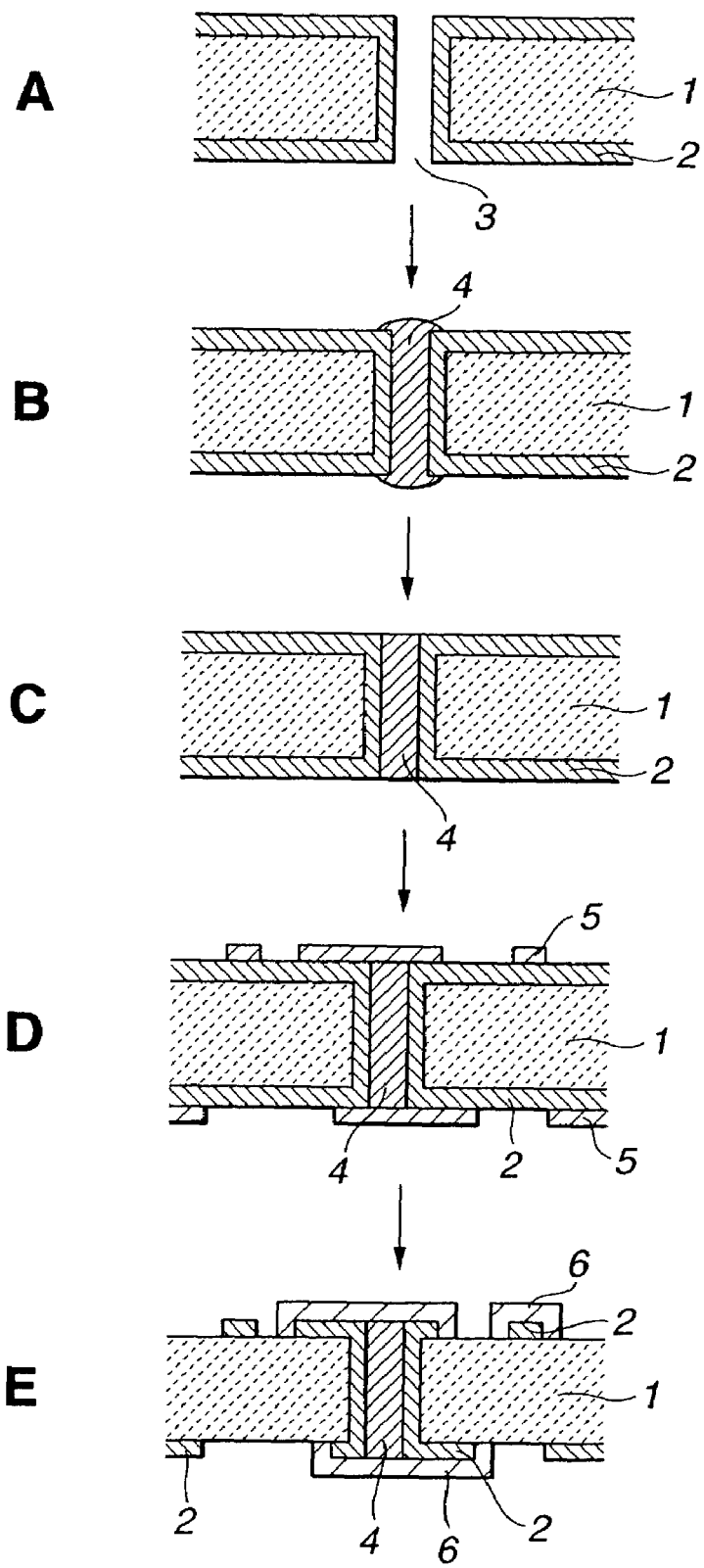
FIG. 1 is a flow diagram of manufacturing process of a plugged-through-hole double-sided printed wiring board coated with a solder mask according to the present invention and shows cross sectional views of a printed wiring substrate and a printed wiring board.

Referring now to FIGS. 1-8, working examples of the present invention will be described in more detail below.

The photo-setting and thermosetting resin composition of the present invention contains a partial adduct of epoxy rein with unsaturated aliphatic acid as the component (I).

The epoxy value of the epoxy resin as the raw material for preparing the component (I) (hereinafter sometimes referred to as "epoxy resin for the raw material") is for example 130~400, particularly 150~250. When the epoxy value is less than 130, the viscosity of the phorosetting and thermosetting resin composition obtained becomes low excessively and applicability degrades. On the contrary, when the epoxy value is in excess of 400, the crosslinking density of set product lowers and the heat-resistance degrades.

Further, the number of epoxy group in the epoxy resin for the raw material is preferably at least two, and usually three and above. When the number of epoxy group is one, the epoxy group is used for the primary setting reaction described later and can not take part in the secondary setting reaction. As a result, a set product having sufficient crosslinking density can not be obtained and the heat-resistance of the set product is not sufficient.

Examples of the epoxy resin for the raw material include a phenolic novolak-type epoxy resin, epoxy resin prepared from polyfunctional phenol, epoxy rein having a naphthalene skeleton, a glycidylamine-type epoxy resin, epoxy rein having a triazine skeleton, a glycidylester-type epoxy resin, an alicyclic-type epoxy resin and so on.

Examples of the epoxy resin prepared from polyfunctional phenol include an orthocresol novolak-type, a bisphenol (DPP) novolak-type, a trifunctional-type (trishydroxyphenylmethane and so on), an alkyl-substituted trifunctional-type, a tetrafunctional-type (tetraphenylolethane and so on), a dicyclopentadienephenole-type and other epoxy resins. Specific examples include those illustrated by structural formulae I-1~I-25 shown in Tables 1~4.

TABLE 1 structural formula

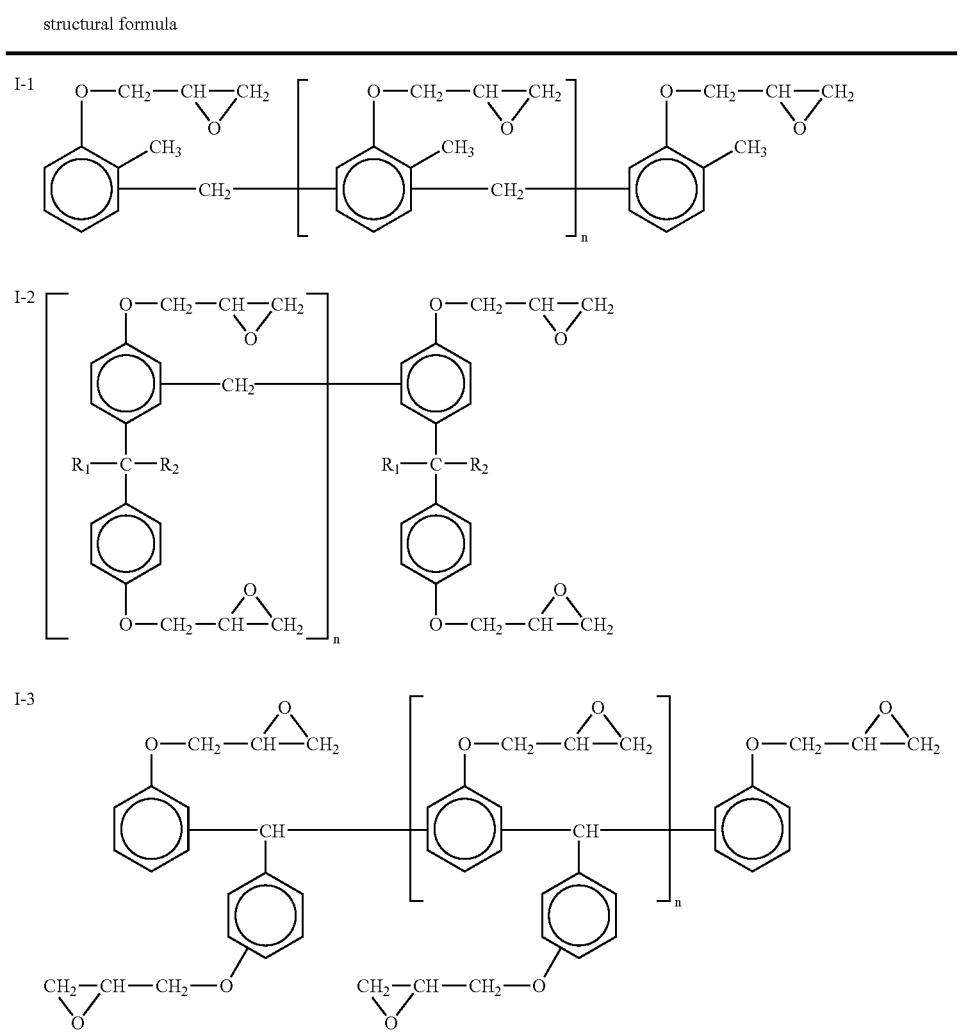

TABLE 1-continued

| structural formula |
|---|
| I-4 (alkyl-substituted trifunctional-type epoxy structure) |
| I-5 (trifunctional-type epoxy structure) |
| I-6 (tetrafunctional-type, tetraphenylolethane epoxy structure) |

I-1: orthocresol novolak-type
I-2: bisphenol(DPP)novolak-type
I-3: trifunctional-type(trishydroxyphenylmethane-type)
I-4: alkyl-substituted trifunctional-type
I-5: trifunctional-type
I-6: tetrafunctional-type, tetraphenylolethane

TABLE 2

| structural formula |
|---|
| I-7 (dicyclopentadiene-phenol epoxy structure with repeating unit $n$) |
| I-8 (triphenylmethane structure with OG substituents) |

TABLE 2-continued
structural formula
I-9
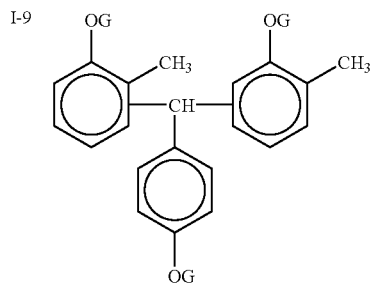
I-10
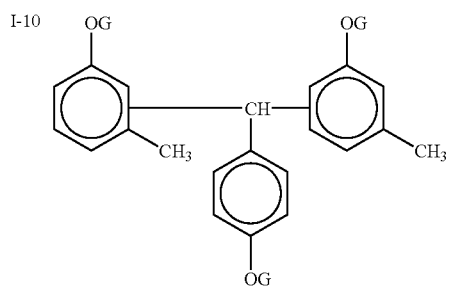
I-11
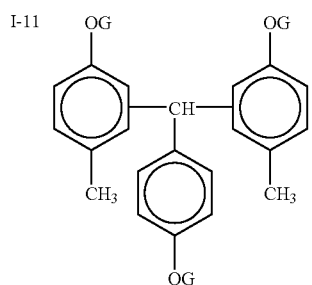
I-12
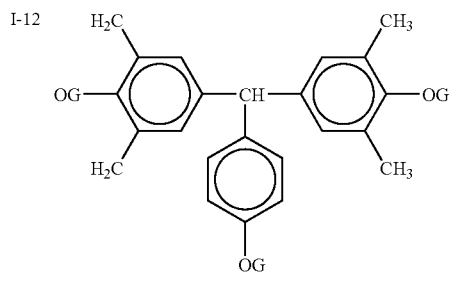
I-13
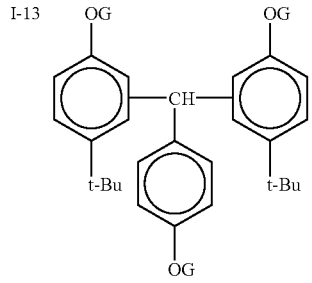

TABLE 2-continued
| structural formula |
|---|
| I-14 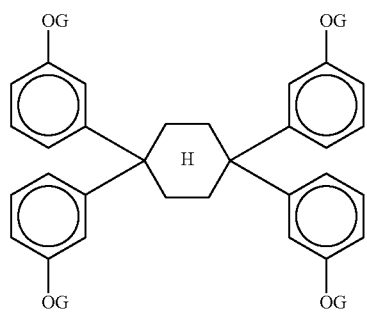 |
| I-15 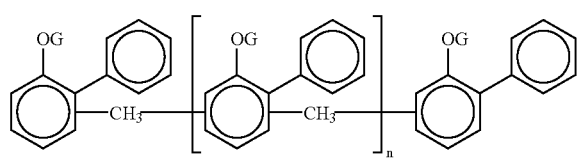 |
I-7: dicyclopentadiene phenol-type
TABLE 3
| structural formula |
|---|
| I-16 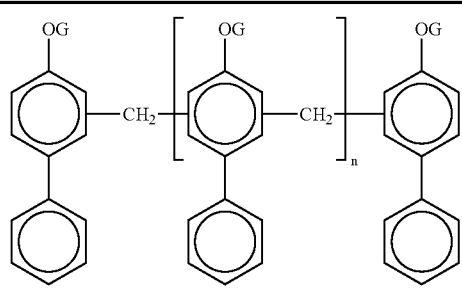 |
| I-17 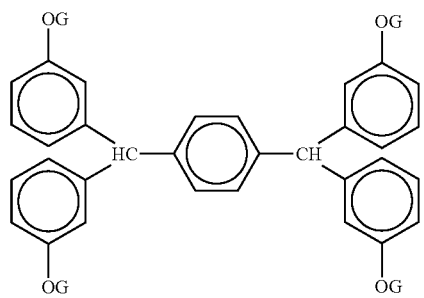 |
| I-18 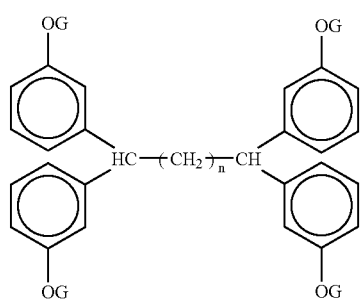 |

TABLE 3-continued structural formula

I-19

[Structure: central benzene ring with OG substituent, connected to two benzene rings each bearing OG, tBu, and Me substituents]

I-20

[Structure: repeating unit with phenol-CH(phenyl)- linkages, terminal OG-substituted phenyl groups, with bracketed repeat unit indicated by subscript n]

I-21

[Structure: OG-substituted phenyl–CH₂–phenyl–CH₂–[OG-substituted phenyl–CH₂–phenyl–CH₂–]ₙ–OG-substituted phenyl]

I-22

[Structure: similar to I-19, central benzene ring with OG substituent connected via bonds to two benzene rings each bearing OG, tBu, and Me substituents]

TABLE 4 structural formula

I-23

[Structure: central carbon with four 4-OG-substituted phenyl groups (tetraphenylmethane derivative)]

TABLE 4-continued

| structural formula |
|---|
| I-24 (structure) |
| I-25 (structure) |

In the structural formulae I-1, I-2, I-3, I-7, I-15, I-20 and I-21, n is an integer of 0 to 30, respectively. In the structural formula I-16, n is an integer of 0 to 20. In the structural formula I-18, n is an integer of 0 to 2. In the structural formula I-25, n is an integer of 1 to 30. In the structural formula I-2, $R_1$ and $R_2$ are independently H or $CH_3$, respectively. In the structural formula I-4, $R_1$ is t-$C_4H_9$ and $R_2$ is $CH_3$. In the Tables 2 to 4, G is a glycidyl group.

Preferable examples are those illustrated by the structural formulae I-1, I-2, I-3 and I-7.

An example of epoxy resin having a naphthalene skeleton includes a naphthalenearalkyl-type epoxy resin. Specific examples include those illustrated by the structural formulae I-26 to I-32 shown in Table 5.

TABLE 5

| structural formula |
|---|
| I-26 (structure) |
| I-27 (structure) |
| I-28 (structure) |

TABLE 5-continued

| | structural formula |
|---|---|
| I-29 | (naphthalene-based structure with OG groups, CH₂ linker, H and n subscript) |
| I-30 | (bis-naphthol structure with OG groups linked via CH₂-phenyl-CH₂, H, n) |
| I-31 | (bis-naphthol structure with multiple OG and GO groups linked via CH₂-phenyl-CH₂, H, n) |
| I-32 | (naphthalene with OG and GO substituents) |

In the structural formulae I-27, I-30 and I-31, n is an integer of 1 to 30, respectively. In the structural formula I-29, n is an integer of 2 to 30. In the Tables 5, G is a glycidyl group. Preferable examples are those illustrated by the structural formulae I-27 and I-31.

An example of glycidylamine-type epoxy resin includes a poly (for example, tri or tetra and so on) glycidylamine-type epoxy resin. Specific examples include those illustrated by the structural formulae I-33 to I-36 shown in Table 6.

TABLE 6

| | structural formula |
|---|---|
| I-33 | (tetraglycidyl diaminodiphenylmethane structure) |
| I-34 | (triglycidyl aminophenol structure) |
| I-35 | (tetraglycidyl structure with two C(CH₃)₂ bridges between phenyl rings) |

TABLE 6-continued structural formula

I-36

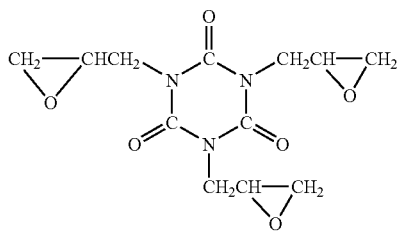

A specific example of epoxy resin having a triazine skeleton is illustrated by the structural formula (1):

(1)

[structural formula of triazine-based triglycidyl compound]

Examples of glycidylester-type epoxy resin include a dimer acid-type epoxy resin such as dimer acid diglycidylester and so on, a phthalic acid-type epoxy resin such as hexahydrophthalic acid diglycidylester and so on, a glycidylacrylate, a glycidylmethacrylate and so on.

Examples of alicyclic-type epoxy resin include a cyclohexeneoxide-type epoxy resin. Specific examples include those illustrated by the structural formulae I-37 to I-41 shown in Table 7. In the structural formula I-41, M is an integer of 2 to 50. Those illustrated by the structural formula I-41 are preferable.

TABLE 7 structural formula

I-37 [cyclohexene-oxide structure]

I-38 [cyclohexene-oxide structure with CH₂OC(CH₂)₄COCH₂ bridge]

I-39 [cyclohexene-oxide structure with CH₂O—C(=O) bridge]

I-40 [cyclohexene-oxide structure with CH—CH₂ linkage]

TABLE 7-continued structural formula

I-41 [cyclohexene-oxide polymer structure with M repeating units]

Examples of the unsaturated aliphatic acid as another raw material for preparation of the component (I) include those illustrated by the following formula (2):

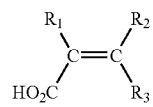

[Wherein, $R_1$ to $R_3$ is independently H or $CH_3$, respectively.] Specific examples of the unsaturated aliphatic acid include an acrylic acid, a methacrylic acid, and a crotonic acid and so on.

The component (I) may be prepared by a conventional preparing method. For example, it may be prepared by mixing at least one kind of epoxy resin for the raw material with at least one kind of unsaturated aliphatic acid (for example acrylic acid and/or methacrylic acid (hereinafter referred sometimes to as "(meth)acrylic acid") with stirring under heating, if necessary.

The component (I) is an adduct in which an unsaturated aliphatic acid is added partially to epoxy rein. That is to say, the partial adduct of the epoxy resin with the unsaturated aliphatic acid contains at least one epoxy group remained in the epoxy resin to which the unsaturated aliphatic acid is added.

Specifically, it is preferable to add the unsaturated aliphatic acid to 20~80%, particularly 40~60% of epoxy groups in the epoxy resin for the raw material. An adduct in which an addition amount of the unsaturated aliphatic acid is less than 20% (hereinafter sometimes described in such a mode of expression as "less than 20% of unsaturated aliphatic acid adduct") causes stickiness of the photo-setting and thermo-setting resin composition. Consequently, when it is primary set, the extra amount of the resin can not be sufficiently removed. On the contrary, a "more than 80% of unsaturated aliphatic acid adduct" hardens the primary set product and makes the subsequent polishing difficult; or crosslinking with the component (IV) at the time of heat-setting can not be sufficiently carried out. As a result, there is a problem that cracks are formed in the set product when soldering is carried out.

An example of the component (I) includes an adduct of novolak-type epoxy resin with (meth) acrylates (specifically, an adduct of cresol novolak-type epoxy resin with acrylic acid). The thermosetting resin composition of the present invention may contain at least one kind of these adducts.

The photo-setting and thermosetting resin composition of the present invention contains (meth) acrylates (that is, acrylates and/or methacrylates) as the component (II).

Examples of the above-described acrylates for the component (II) include esters of acrylic acids with hydroxyl compounds and so on. Examples of the above-described methacrylates for the component (II) include esters of methacrylic acids with hydroxyl compounds and so on.

Examples of the above-described acrylic acids and methacrylic acids include unsaturated aliphatic acids illustrated by the afore-mentioned chemical formula (2). Specific examples of acrylic acids and methacrylic acids include acrylic acid, methacrylic acid and crotonic acid and so on.

Examples of the above-described hydroxyl compounds include alcohols, (hemi) acetals or (hemi) ketals, hydoroxyesters and so on.

Examples of the alcohols include lower alcohol, cyclic alcohol, polyhydric alcohols, aromatic alcohols and so on.

Examples of the lower alcohol include alcohols having C1~C10. Specific examples of the lower alcohol include butanol, hexanol, 2-ethylhexylalcohol and so on.

Examples of the cyclic alcohol include monocyclic or polycyclic (bicyclic, tricyclic and so on) alkyl or alkenyl alcohol. Specific examples of the cyclic alcohol include dicyclopentanyl alcohol, dicyclopentenyl alcohol, isobonilic alcohol, furufuryl alcohol, and so on.

Examples of the polyhydric alcohols include polyhydric alcohol and derivatives thereof, for example, a partial ether of polyhydric alcohol, an adduct of polyhydric alcohol with ethylene oxide (EO adduct), a partial ester of polyhydric alcohol and so on.

Examples of the polyhydric alcohol include alkanediole or cycloalkanediole having C2~C8, glycols, bisphenol A, erythritols and so on.

Specific examples of the polyhydric alcohol include 1,3-propanediol, ethylene glycol, dicyclopentanediol, neopentylglycol, diethylene glycol, polyethylene glycol, 1, 4-butanediol, bispheno-A, pentaerythritol, dipentaerythritol, ditrimethylolpropane and so on.

Examples of the partial ether of polyhydroxy alcohol include a partial aryl ether of the above-described polyhydric alcohol (partial phenyl or cresyl ether and so on), partial alkyl ("alkyl" having C1~C4) or alkenyl ("alkenyl" having C1~C4) ether (partial butyl ether, partial allyl ether and so on) and so on.

Examples of the adduct of polyhydric alcohol with ethylene oxide (EO adduct) include a mono EO adduct of the above-described polyhydric alcohol, POE (EO polymerization degree of 2~6) ether-modified compound and so on. In this case, EO may be added to a part or all hydroxyl groups in the polyhydric alcohol.

The partial ester of the polyhydric alcohol is, for example, an ester of the above-described polyhydric alcohol with carbocyclic carboxylic acid (benzoate and so on), a hydroxy acid ester (hydroxypivalic acid and so on) and so on.

Specific example of the aromatic alcohol includes benzyl alcohol and so on.

Examples of the (hemi) acetals or (hemi) ketals for the above-described hydroxyl compounds include condensates of the above-described alcohols (for example, cyclic alcohol, polyhydric alcohol and so on) with formaldehyde or hydroxyaldehyde. Specific examples include formaldehyde.dicyclopentenyl.hemiacetal, tricyclodecanedimethanol, neopenthylglycol-modified trimethylolpropane and so on.

The hydroxy acid ester as a hydroxyl compound is, for example, a ring cleavage adduct of caprolactone with furfuryl alcohol, hydroxypivalic acid neopenthylglycol and so on.

The component (II) is preferable a compound which is set singly to form a set product having Tg(° C.) of 80~180, particularly 120~150. When Tg is less than 80, the primary set product is sticky. On the contrary, when Tg is in excess of 180, the primary set product becomes hard excessively.

When the component (II) does not contain a hydrophilic group such as a carboxylic group, hydroxyl group and so on, the hygroscopicity of the photo-setting and thermosetting resin composition can be suppressed low. As a result, the humidity-resistance of the set product can be increased.

Specific examples of the component (II) are compounds illustrated by the structural formulae II-1~II-35 shown in Tables 8~12. The component (II) may contain at least one kind of these compounds.

The component (II) are preferably compounds illustrated by the structural formulae II-6, II-7, II-8, II-9, II-23, II-24, II-26, II-27, II-28. The component (II) may contain at least one kind of these compounds. In the structural formula II-5, n is 1 or 2. In the structural formula II-6, R is h or $CH_3$.

TABLE 8

| | structural formula |
|---|---|
| II-1 | $H_2C{=}CH{-}\overset{O}{\underset{\|}{C}}O{-}CH_2{-}\underset{OH}{\overset{\|}{CH}}{-}CH_2{-}OCH_2CH{=}CH_2$ |
| II-2 | $H_2C{=}CH{-}\overset{O}{\underset{\|}{C}}O{-}CH_2{-}\bigcirc$ |
| II-3 | $H_2C{=}CH{-}\overset{O}{\underset{\|}{C}}O{-}CH_2CH_2{-}O{-}C_4H_9$ |
| II-4 | $H_2C{=}CH{-}\overset{O}{\underset{\|}{C}}O{-}C_4H_9$ |
| II-5 | $CH_2{=}CH{-}\overset{O}{\underset{\|}{C}}{-}{\vdash}CH_2CH_2O{\dashv}_n\bigcirc{-}CH_3$ |
| II-6 | $H_2C{=}CRCO{-}\bigcirc\hspace{-6pt}\bigcirc$ with O double bond |
| II-7 | $H_2C{=}CH{-}\overset{O}{\underset{\|}{C}}O{-}\bigcirc\hspace{-6pt}\bigcirc$ |
| II-8 | $H_2C{=}CH{-}\overset{O}{\underset{\|}{C}}OCH_2{-}O{-}\bigcirc\hspace{-6pt}\bigcirc$ |

TABLE 9

| | structural formula |
|---|---|
| II-9 | H$_2$C=CH—COC$_2$H$_4$—O—[tricyclic]—O—C$_2$H$_4$O—C(=O)—CH=CH$_2$ |
| II-10 | CH$_2$=CH—C(=O)—O—C$_2$H$_4$O—C$_6$H$_5$ |
| II-11 | CH$_2$=CH—C(=O)—O—C$_2$H$_4$O—C$_6$H$_5$ |
| II-12 | CH$_2$=CH—C(=O)—O—CH$_2$CH(CH$_3$)$_2$ |
| II-13 | CH$_2$=CH—C(=O)—O—CH$_2$—C(CH$_3$)$_2$—CH$_2$O—C(=O)—C$_6$H$_5$ |
| II-14 | CH$_2$=CH—C(=O)—(OC$_2$H$_4$)$_2$—O—C$_6$H$_5$ |
| II-15 | CH$_2$=CH—C(=O)—OC$_2$H$_4$—O—C$_6$H$_5$ |
| II-16 | (tetrahydrofuranyl)—CH$_2$—O—C(=O)—CH=CH$_2$ |

TABLE 10

| | structural formula |
|---|---|
| II-17 | (tetrahydrofuranyl)—CH$_2$—O—C(=O)—(CH$_2$)$_5$—O—C(=O)—CH=CH$_2$ |
| II-18 | CH$_2$=CH—C(=O)—O—C(CH$_3$)$_3$ |
| II-19 | CH$_2$=CH—C(=O)—O—CH$_2$CH$_2$—CH(CH$_3$)—OC(=O)—CH=CH$_2$ |
| II-20 | CH$_2$=CH—C(=O)—O—CH$_2$CH$_2$—CH(CH$_3$)—OC(=O)—CH=CH$_2$ |
| II-21 | CH$_2$=CH—C(=O)—OCH$_2$—C(CH$_3$)$_2$—CH$_2$—OC(=O)—C(CH$_3$)$_2$—CH$_2$—OC(=O)—CH=CH$_2$ |

TABLE 10-continued structural formula

II-22

$$CH_2{=}CH-\underset{O}{\overset{O}{C}}-O-CH_2-\underset{CH_3}{\overset{CH_3}{C}}-CH_2-O-\overset{O}{C}-CH{=}CH_2$$

II-23

H$_2$C=CH—COCH$_2$—O—[bicyclic]—O—CH$_2$O—C—CH=CH$_2$ (with C=O groups)

II-24

$$CH_2{=}CH-\overset{O}{C}O-CH_2-\underset{CH_3}{\overset{CH_3}{C}}\underset{O-CH_2}{\overset{O-CH_2}{>}}CH-\underset{CH_2-OC-CH-CH_2}{\overset{CH_2CH_3}{C}}$$

TABLE 11 structural formula

II-25

$$H_2C{=}CH-\overset{O}{C}O-(OC_2H_4)_2-\underset{}{\overset{}{\bigcirc}}-\underset{CH_3}{\overset{CH_3}{C}}-\underset{}{\overset{}{\bigcirc}}-(OC_2H_4)_2-O\overset{O}{C}-CH{=}CH_2$$

II-26

[bornyl structure with CH$_3$ groups]—O—C(=O)—CH=CH$_2$

II-27

$$H_2C{=}HC-\overset{O}{C}-O-CH_2-\underset{CH_2-O-C-CH{=}CH_2}{\overset{CH_2-O-C-CH{=}CH_2}{C}}-CH_2OH$$

II-28

$$\begin{array}{c}H_2C{=}HC-\overset{O}{C}-O-H_2C\\H_2C{=}CH-\overset{O}{C}-O-H_2C\\H_2C{=}HC-\overset{O}{C}-O-H_2C\end{array}\overset{}{C}-CH_2-O-CH_2-\overset{}{C}\begin{array}{c}CH_2-O-\overset{O}{C}-CH{=}CH_2\\CH_2-O-\overset{O}{C}-CH{=}CH_2\\CH_2-O-\overset{O}{C}-CH{=}CH_2\end{array}$$

II-29

$$\begin{array}{c}H_2C{=}HC-\overset{O}{C}-O-H_2C\\H_2C{=}HC-\overset{O}{C}-O-H_2C\end{array}\underset{H_3CH_2C}{\overset{}{C}}-CH_2-O-CH_2-\underset{CH_2CH_3}{\overset{}{C}}\begin{array}{c}CH_2-O-\overset{O}{C}-CH{=}CH_2\\CH_2-O-\overset{O}{C}-CH{=}CH_2\end{array}$$

TABLE 11-continued structural formula

II-30

$$H_2C=HC-\overset{O}{\underset{\|}{C}}-O-CH_2\diagdown_{C}\diagup CH_2-O-\overset{O}{\underset{\|}{C}}-CH=CH_2$$
$$H_2C=HC-\underset{\underset{O}{\|}}{C}-O-CH_2\diagup\diagdown CH_2-O-\underset{\underset{O}{\|}}{C}-CH=CH_2$$

II-31

$$CH_2=CH-\underset{CO-N}{\overset{}{|}}\diagdown O$$

TABLE 12 structural formula

II-32

$$H_2C=CH-\underset{\underset{O}{\|}}{C}-OCH_2-\underset{\underset{C_2H_5}{|}}{\overset{C_2H_5}{|}}-CH_2-OC-CH=CH_2$$

II-33

$$H_2C=CH-\underset{\underset{O}{\|}}{C}O-CH_2CH(C_2H_5)-C_4H_9$$

II-34

$$H_2C=CH-\underset{\underset{O}{\|}}{C}-O-(OC_2H_4)_2-CH_2-\underset{\underset{C_2H_5}{|}}{CH}-C_4H_9$$

II-35

$$H_2C=CH-\underset{\underset{O}{\|}}{C}O-CH_2-CH_2-CH_3$$

The photo-setting and thermosetting resin composition of the present invention contains as the component (III) a photocrosslinking agent. The component (III) is preferably a photocrosslinking agent which is irradiated with light, for example, UV light of wavelength 200~400 nm to initiate the primary setting reaction.

Specific examples of the component (III) are hydroxyketones [those illustrated by the structural formulaeIII-1~III-4 shown in Table 13], benzylmethylketals[those illustrated by the structural formulaIII-5 shown in Table 13], acylphosphine oxides [those illustrated by the structural formulaeIII-6~III-9 shown in Table 14], aminoketones [those illustrated by the structural formulaeIII-10~III-11 shown in Table 14], benzoic ethers [those illustrated by the structural formulaeIII-121~III-15 shown in Table 15], benzoyl compounds [benzophenones illustrated by the structural formulaeIII-161~III-25 shown in Tables 16 and 17, and those illustrated by the structural formulaeIII-26~III-28 shown in Table 17], thioxanthones [those illustrated by the structural formulaeIII-30~III-32 shown in Table 18], biimidazoles [those illustrated by the structural formulaeIII-33~III-34 shown in Table 18], dimethylaminobenzoates [those illustrated by the structural formulaeIII-35~III-36 shown in Table 19], sulfonium salts [riarylsulfonium salts illustrated by the structural formulaeIII-37~III-39 shown in Table 19, and that illustrated by the structural formulaIII-40 shown in Table 19], anthraquinones [that illustrated by the structural formulaIII-41 shown in Table 20], acridones [that illustrated by the structural formulaeIII-42 shown in Table 20], acridines [that illustrated by the structural formulaeIII-43 shown in Table 20], carbazoles [that illustrated by the structural formulaeIII-44 shown in Table 20], titanium complex[that illustrated by the structural formulaeIII-45 shown in Table 20]. The component (III) may contain at least one of these compounds.

TABLE 13 structural formula

III-1

$$HO-CH_2CH_2O-\underset{}{\overset{}{\bigcirc}}-\underset{\underset{O}{\|}}{C}-\underset{\underset{CH_3}{|}}{\overset{CH_3}{|}}-OH$$

III-2

$$\underset{}{\overset{}{\bigcirc}}-\underset{\underset{O}{\|}}{C}-\underset{\underset{}{|}}{\overset{OH}{|}}\underset{}{\overset{}{\bigcirc}}$$

III-3

$$\underset{}{\overset{}{\bigcirc}}-\underset{\underset{O}{\|}}{C}-\underset{\underset{CH_3}{|}}{\overset{CH_3}{|}}-OH$$

III-4

$$H\text{---}\left[CH_2\text{---}\underset{\underset{\bigcirc}{|}}{\overset{CH_3}{|}}\text{---}CH_2\right]_n\text{---}H$$
$$\underset{\underset{\overset{}{\overset{}{|}}}{|}}{\overset{}{\bigcirc}}$$
$$\underset{H_3C-\underset{\underset{OH}{|}}{\overset{C=O}{|}}-CH_3}{}$$

III-5

$$\underset{}{\overset{}{\bigcirc}}-\underset{\underset{O}{\|}}{C}-\underset{\underset{OCH_3}{|}}{\overset{OCH_3}{|}}\underset{}{\overset{}{\bigcirc}}$$

III-1: 1-[4-(2-hydroxyethoxy)phenyl]-2-hydroxy-2-methyl-1-propan-1-on
III-2: 1-hydroxy-cyclohexyl-phenyl-ketone
III-3: 2-hydroxy-2-methoxy-1-phenyl-propan-1-on
III-4: 2-hydroxy-2-methyl-[4-(1-methylvinyl)phenyl]-propanol oligomer
III-5: 2,2-dimethoxy-1,2-diphenylethan-1-on

TABLE 14 structural formula

III-6: (structure shown)

III-7: (structure shown)

III-8: (structure shown)

III-9: (structure shown)

III-10: (structure shown)

III-11: (structure shown)

III-6: 2,4,6-trimethyl benzoyl diphenyl phosphine oxide
III-7: 2,4,6-trimethyl benzoyl phenyl ethoxy phosphine oxide
III-8: bis(2,4,6-trimethylbenzoyl)-phenyl phosphine oxide
III-9: bis(2,6-dimethoxybenzoyl)-2,4,4-trimethyl-pentylPhosphine oxide(A), 1-hydroxy-cyclohexyl-phenyl-ketone
III-10: 2-benzyl-2-dimethylamino-1-(4-morpholinophenyl)butanon-1
III-11: 2-methyl-1-[4-methylthio]phenyl]-2-morpholinopropan-1-on

TABLE 15 structural formula

III-12: (structure shown)

III-13: (structure shown)

III-14: (structure shown)

III-15: (structure shown)

III-12: benzoin methyl ether
III-13: benzoin ethyl ether
III-14: benzoin isobutyl ether
III-15: benzoin isopropyl ether

TABLE 16 structural formula

III-16: (structure shown)

III-17: (structure shown)

III-18: (structure shown)

III-19: (structure shown)

III-20: (structure shown)

TABLE 16-continued structural formula

III-21

(C₂H₅)₂N—⟨phenyl⟩—C(=O)—⟨phenyl⟩—N(C₂H₅)₂

III-16: methyl o-benzoyl benzoate
III-17: [4-(methylphenylthio)phenyl]phenylmethane
III-18: benzophenone
III-21: 4,4'-bisdiethylaminobenzophenone

TABLE 17 structural formula

III-22

⟨phenyl⟩—C(=O)—⟨phenylene⟩—C(=O)—⟨phenyl⟩

III-23

⟨phenyl⟩—⟨phenylene⟩—C(=O)—⟨phenyl⟩

III-24

⟨phenyl⟩—O—⟨phenylene⟩—C(=O)—⟨phenyl⟩

TABLE 17-continued structural formula

III-25

⟨phenyl⟩—C(=O)—⟨phenylene⟩—O(C₂H₄)O—C(=O)—CH=CH₂

III-26

⟨naphthyl⟩—C(=O)—⟨phenyl⟩

III-27

⟨phenyl⟩—C(=O)—C(=O)—⟨phenyl⟩

III-28

⟨phenyl⟩—C(=O)—⟨phenylene(o-CO₂CH₃)⟩

III-22: 1,4-dibenzoyl benzene
III-23: 4-benzoyl biphenyl
III-24: 4-benzoyl diphenyl ether
III-25: acrylated benzophenone
III-26: 2-benzoyl naphthalene
III-27: benzyl(dibenzoyl)

TABLE 18 structural formula

III-29

Thioxanthone with CH(CH₃)₂ substituent

III-30

Thioxanthone with two C₂H₅ substituents

III-31

Thioxanthone with Cl substituent

III-32

Thioxanthone with OCH₂CCH₂N⊕(CH₃)₃ (OH), CH₃, CH₃ substituents; Cl⊖ counterion

TABLE 18-continued
| structural formula |
|---|
| III-33 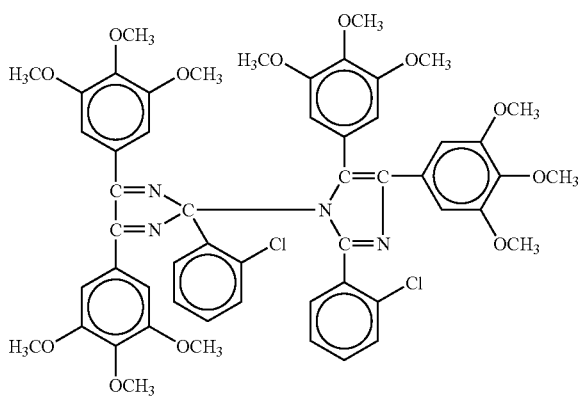 |
| III-34 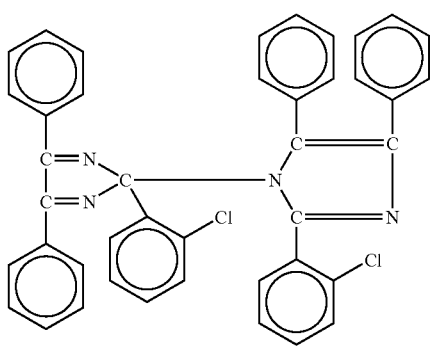 |
III-29: isopropylthioxanthone
III-30: 2,4-diethylthioxanthone
III-31: 2,-chlorothioxanthone
III-33: 2,2'bis(o-chlorophenyl)$_4$,5,4', 5'-tetrakis(3,4,5-trimethoxyphenyl)1,2'-biimidazole
III-34: 2,2'-bis(o-chlorophenyl)$_4$, 5,4',5'-tetraphenyl-1,2'-biimidazole
TABLE 19
| structural formula |
|---|
| III-35 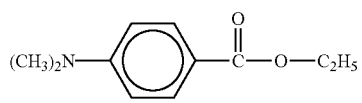 |
| III-36 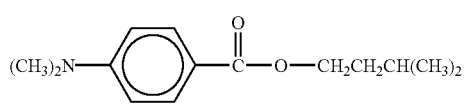 |
| III-37 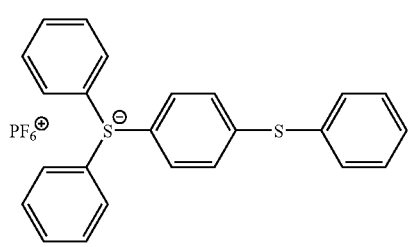 |

TABLE 19-continued
structural formula
III-38
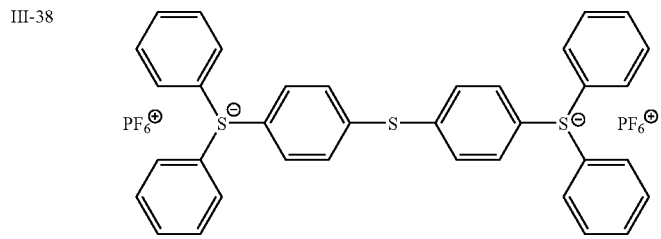
III-39
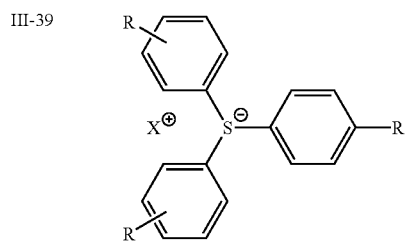
III-40
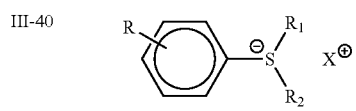
III-35: ethyl p-dimethylaminobenzoate
III-36: isoamylethyl p-dimethylaminobenzoate
TABLE 20
structural formula
III-41
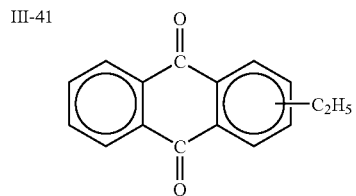
III-42
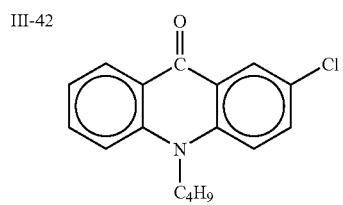
III-43
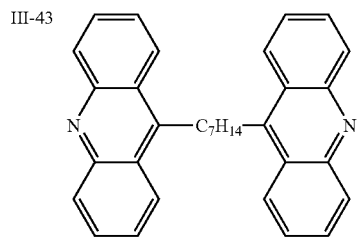

TABLE 20-continued structural formula

III-44

[structure of III-44]

III-45

[structure of III-45]

III-41: ethylanthraquinone
III-42: 10-butyl-2-chloroacridone
III-45: bis(5-2-4-cyclopentadiene-1-yl)-bis(2,6-difluoro-3-(1H-pyrrole-1-yl)-phenyl) titanium In the structural formula III-18 shown in Table 16, R is H or Me. Examples illustrated by the structural formula III-18 include benzophenone, 2-or 4-methylbenzophenone and so on.

In the structural formula III-20 shown in Table 16, R, $R_1$ and $R_2$ are independently H or Me, respectively (except the compound illustrated by the structural formula III-18). An example illustrated by the structural formula III-18 includes 2,4, 6-trimethylbenzophenone.

In the structural formula III-39 shown in Table 19, R is H or Me, X is $PF_6$ or $SbF_6$. In the structural formula III-40 shown in Table 19, R, $R_1$ and $R_2$ are independently H or Me, respectively, X is $PF_6$ or $SbF_6$.

Preferable examples of the component (III) include compounds illustrated by the structural formulae III-6 and III-11. The component (III) may contain at least one of these compounds.

The photo-setting and thermosetting resin composition of the present invention contains a liquid epoxy resin as the component (IV). The term herein used "liquid" means a liquid or semisolid state at ordinary temperatures. The component (IV) may be epoxy rein having fluidity at ordinary temperatures. Such component (IV) has preferably the viscosity (room temperature, mPa.s) of 20000 and below, particularly 1000~10000. When the viscosity of the component (IV) is high or low excessively, the viscosity of the resin composition also becomes high or low, the applicability and hole plugging ability of the resin composition lower.

An example of the component (IV) includes a bisphenol A-type epoxy resin illustrated by the structural formula (3):

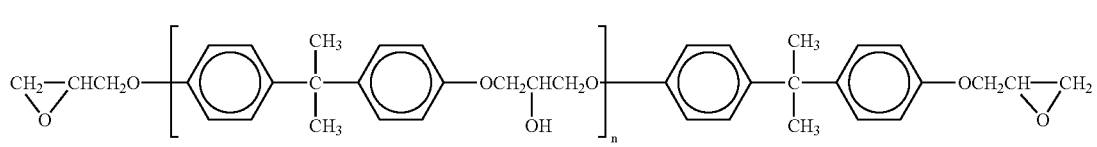

(3)

(Wherein, n is 0 or 1.) The component (IV) may contain at least one of these epoxy resins.

Further, an example of the component (IV) includes a bisphenol F-type epoxy resin illustrated by the structural formula (4):

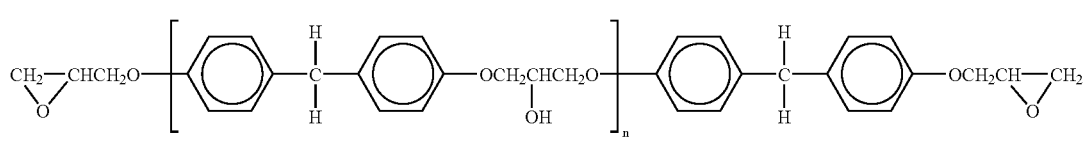

(4)

(Wherein, n is 0 or 1.) The component (IV) may contain at least one of these epoxy resins.

Furthermore, examples of the component (IV) include a naphthalene-type[a compound illustrated by the structural formula IV-1 shown in Table 21], a diphenylthioether sulfide [a compound illustrated by the structural formula IV-2 shown in Table 21], a trityl-type[a compound illustrated by the structural formula IV-3 shown in Table 21], an alicyclic-type [those illustrated by the structural formulae IV-4~IV-8 shown in Tables 21 and 22]. The component (IV) may contain at least one of these compounds.

Furthermore, examples of the component (IV) include a compound prepared from alcohols [a compound illustrated by the structural formula IV-9 shown in Table 22], a diallylbis A-type[a compound illustrated by the structural formula IV-10 shown in Table 21], a methylresorcinol-type[a compound illustrated by the structural formula IV-11 shown in Table 22], a bisphenol AD-type [those illustrated by the structural formulae IV-12-IV 17 shown in Tables 22 and 23], N,N,O-tris(glycidyl)-p-aminophenol. The component (IV) may contain at least one of these compounds.

TABLE 22-continued structural formula

IV-11: 5-methyl-1,3-bis(glycidyloxy)benzene structure with two O—CH₂—CH(O)—CH₂ groups on benzene ring bearing CH₃

IV-12: GO—C₆H₄—C(R)(R₁)—C₆H₄—OG

IV-13: GO—C₆H₄—C(H)(CH₃)—C₆H₄—OG

IV-14: GO—C₆H₄—C(H)(C₆H₁₃)—C₆H₄—OG

TABLE 23 structural formula

IV-15: GO—C₆H₄—C(H)(C₁₂H₂₅)—C₆H₄—OG

IV-16: GO—C₆H₄—C(CH₃)(C₂H₅)—C₆H₄—OG

IV-17: GO—C₆H₄—C(CH₃)(C₄H₉)—C₆H₄—OG

In Tables 21~23, G is a glycidyl group. In the structural formula IV-8 shown in Table 22, M is an integer of 2~50.

In the structural formula IV-9 shown in Table 22, n is an integer of 1~3, R is an alcohol residue with a hydroxyl group removed. Examples of alcohols include those illustrated by the formula R(OH)$_n$[Wherein, n and R are the same as those in the structural formula IV-9]

Examples of the above-described alcohols include higher alcohol of C12~C24, polyhydric (bihydric, tirhydric and so on) alcohol and so on. Specific examples of higher alcohol include stearyl alcohol and so on. Specific examples of polyhydric alcohol include 1,6-hexanediole, polyoxyalkylene glycol (for example, POE glycol, polyoxypropylene (POP) glycol and so on], bisphenol A/alkylene oxide [for example, EO, propylene oxide(PO) and so on] adduct, trimethylolpropane, glycerine and so on.

An example of bisphenol AD-type include a compound illustrated by the structural formula IV-12 shown in Table 22.

In the structural formula IV-12 R is H or an alkyl group of C1~C4, R₁ is an alkyl group of C1~C12, provided R and R₁ are not CH₃ at the same time. Specific example of bisphenol AD-type include those illustrated by the structural formulae IV-13~IV-17 shown in Tables 22 and 23.

While the component (IV) may contain at least one of the above-described compounds, it contains preferably a bisphenol A-type epoxy resin illustrated by the structural formula (3).

The photo-setting and thermosetting resin composition of the present invention contains a latent curing agent as the component (V). The component (V) causes the secondary setting reaction under heating. The component (V) is preferably, for example, a compound that causes the secondary setting reaction at temperatures of 100~200° C., particularly 130~170° C.

Specific examples of the component (V) include dicyandiamide (DICY), imidazoles, BF₃-amine complex, amine adduct-type curing agent, amine-acid anhydride (polyamide) adduct-type curing agent, hydrazide-type curing agent, carboxylate of amine-type curing agent, onium salt and so on. The component (V) may contain at least one of these compounds.

Examples of the amine adduct-type curing agent as the component (V) include an adduct of imidazoles [2-ethyl-4-methylimidazole, 2-methylimidazole, 2, 4-diamino-6-(2-methylimidazolyl-(1H))-ethyl-s-triazine and so on] or an amines (diethylamine and so on) with an epoxy compound, urea or isocyanate compound.

Specific examples of the hydrazide-type curing agent as the component (V) include adipic acid hydrazide (ADH), sebacic acid hydrazide (SDH) and so on.

Examples of the carboxylate of amine-type curing agent as the component(V) include a nylon salt, ATU (3,9-bis(3-aminopropyl)-2,4,8,10-tetraoxaspiro[5, 5]undecane).adipate and so on.

Examples of the onium salt as the component (V) include sulfonium salt, ammonium salt, phosphonium salt and so on.

Specific examples of the component(V) are those illustrated by the structural formulae V-1~V-18 shown in Tables 24~26. The component (V) may contains at least one of these compounds. Those illustrated by the structural formulae V-1, V-2, V-3 are preferable. In the structural formula V-6, n is an integer of 0~3.

TABLE 24

| | structural formula |
|---|---|
| V-1 | $H_2N-C(=NH)-NH-CN$ |
| V-2 | 2,4-diamino-6-[2-(2-methyl-1-imidazolyl)ethyl]-1,3,5-triazine |
| V-3 | cyanuric acid (1,3,5-triazine-2,4,6-triol, keto form) |
| V-4 | 3,4-dichlorophenyl-N'-N'-dimethylurea |
| V-5 | macrocyclic bis-phthalamide with ethylenediamine linkers |
| V-6 | $HOOC-C_6H_4-C(O)NH-CH_2CH_2-NH-CH_2CH_2-NH-[C(O)-C_6H_4-C(O)NH-CH_2CH_2-NH-CH_2CH_2-NH]_n-H$ |
| V-7 | 5-isopropylhydantoin-1,3-bis(acetohydrazide) |
| V-8 | $H_2NHN-C(O)-(CH_2)_{18}-C(O)-NHNH_2$ |

TABLE 25

| | structural formula |
|---|---|
| V-9 | $H_2NHNC(O)(CH_2)_3CH=CH(CH_2)_2CH=CH(CH_2)_4C(O)NHNH_2$ |

TABLE 25-continued

| | structural formula |
|---|---|
| V-10 | (benzene ring with NH₂NHCO- and -CONHNH₂ substituents in meta positions) |
| V-11 | (1,3,5-triazine ring with NHCH₂, NH₂NH, and NHNH₂ substituents) |
| V-12 | $^+NH_2CH_2CH_2CH_2$—(spirobicyclic diketal)—$CH_2CH_2CH_2NHCOO^-$ |
| V-13 | $R_1$—C₆H₄—CH(R₂)—$^+$S(R₃)(R₄)   SbF₆⁻ |
| V-14 | $R_1$—C₆H₄—CH(R₂)—$^+$N(R₃)(R₃)(R₃)   SbF₆⁻ |
| V-15 | $R_1$—C₆H₄—CH(R₂)—$^+$S(R₃)—C₆H₄—$R_4$   SbF₆⁻ |
| V-16 | $R_1$—C₆H₄—CH(R₂)—$^+$N(pyridinium)   SbF₆⁻ |

TABLE 26

| | structural formula |
|---|---|
| V-17 | $R_1$—C₆H₄—CH₂—$^+$P(C₆H₅)₃   SbF₆⁻ |

TABLE 26-continued

| | structural formula |
|---|---|
| V-18 | $CH_3O$—C₆H₄—CH₂—$^+$N(2-cyanopyridinium)   SbF₆⁻ |

Various kinds of additives may be added to the photo-setting and thermosetting resin composition of the present invention. Examples of the additives include a filler, an anti-foaming agent, an organic.inorganic coloring agent, a fire retardant and so on. The photo-setting and thermosetting resin composition of the present invention may contain at least one of these additives.

Examples of the filler are those having the particle diameter in the range of 0.01μ~50μ. Specific examples of the additive include barium sulfate, silica including colloidal silica, aluminum hydroxide, magnesium hydroxide, alumina, titanium oxide, zirconium oxide, zirconium silicate, calcium carbonate, talk, mica, glass beads, clay, feldspar powder and so on. The photo-setting and thermosetting resin composition of the present invention may contain at least one of these fillers.

When aluminum hydroxide or magnesium hydroxide is used as filler, water is released by heating. As a result, the flame retardancy of the set product is increased.

Preferably, the filler has the refractive index near to that of the resin composition. If there is no significant difference between both refractive indexes, there is no reflection in the interface of the filler and the resin composition; and hence the photo-setting can be carried out effectively. Specific examples of such fillers are glass beads, feldspar powder and so on. The photo-setting and thermosetting resin composition of the present invention may contain at least one of these fillers.

Examples of the anti-foaming agent include polydimethylsiloxane and so on. Example of the organic.inorganic coloring agent include titanium oxide, carbon black, phthalocyanine blue and so on. The photo-setting and thermosetting resin composition of the present invention may contain at least one of these coloring agents.

In the photo-setting and thermosetting resin composition of the present invention, the component (II) may be used not only as a matrix component but also as a solvent. In this case, an additional solvent is not required. When the photo-setting and thermosetting resin composition of the present invention does not contain solvent, a set product having moreover excellent solder-resisting properties can be formed.

It is preferable that the photo-setting and thermosetting resin composition of the present invention comprises 100 parts by weight of the component (I), 100~300 parts by weight (more preferably 150~250 parts by weight) of the component (II), 1~50 parts by weight (more preferably 5~15 parts by weight) of the component (III), 50~200 parts by weight (more preferably 60~120 parts by weight) of the component (IV) and 1~50 parts by weight (more preferably 5~20 parts by weight) of the component (V), and 200~500 parts by weight (more preferably 250~350 parts by weight) of filler.

When the component (II) is less than 100 parts by weight, applicability to the substrate deteriorates. On the contrary, when the component (II) is in excess of 300 parts by weight, the heat-resistance of the set product lowers.

When the component (III) is less than one part by weight, the primary setting can not be sufficiently accomplished. As a result, the set product obtained is sticky and can not be sufficiently polished. On the contrary, when the component (III) is in excess of 50 parts by weight, the primary setting reaction can not be so accelerated.

When the component (IV) is less than 50 parts by weight, the heat-resistance of the set product is not sufficient. On the contrary, when the component (IV) is in excess of 200 parts by weight, the surface of the primary set product is sticky and the subsequent polishing process can not be carried out satisfactorily.

When the component (V) is less than one part by weight, the secondary setting reaction can not be sufficiently carried out, and hence the heat-resistance and humidity-resistance of the set product obtained are not sufficient. On the contrary, when the component (V) is in excess of 30 parts by weight, the secondary setting reaction can not be so accelerated.

When the filler is less than 200 parts by weight, the resin composition charged and plugged into the through-hole flows away from the through-hole. On the contrary, when the filler is in excess of 500 parts by weight, the applicability of the resin composition lowers.

For example, the photo-setting and thermosetting resin composition of the present invention may be prepared by mixing the components (I)~(V) with additives if necessary, dispersing homogeneously and deaerating under vacuum. The order of addition of each of the components is not particularly limited. Each of the components may be added sequentially or all components may be added at a time.

For example, the component (I), the component (II) and the component (III), and additives and so on if necessary are mixed under stirring, dispersed by triple roll and deaerating under vacuum and so on to prepare a first composition. Similarly to this, a second composition is prepared from the component (IV) and the component (V). Thereafter, the first and second compositions are mixed homogeneously under stirring to form the photo-setting and thermosetting resin composition of the present invention.

Taking the applicability to the substrate into consideration, the photo-setting and thermosetting resin composition of the present invention prepared in such a manner as above described has preferably the resin viscosity(Pa.s, room temperature) of 10~50, particularly 15~30.

The plugged-through-hole printed wiring (substrate) board of the present invention can be prepared by using the above-described photo-setting and thermosetting resin composition. The plugged-through-hole double- or single-sided printed wiring board of the present invention can be prepared by plugging the above-described photo-setting and thermosetting resin composition into the through-hole of the double- or single-sided printed wiring substrate, photo-setting to form a photo-set product, polishing the surface of the substrate, thereafter (A) thermosetting said photo-set product and forming a conductor circuit, or (B) forming the conductor circuit and thermosetting said photo-set product.

The term "a double- or single-sided printed wiring substrate" herein used means all plate-like articles valuable for a material for producing a double- or single-sided printed wiring board. Such a double- or single-sided printed wiring substrate has, for example, a structure in which either one or both surfaces of an insulating substrate is coated with a conductive film, and the internal wall of the through-hole is also coated with the conductive film.

The above-mentioned insulating substrate is, for example, a resin substrate prepared by applying (or impregnating) resin (epoxy resin, polyimide resin and so on) to (or into) a reinforcing material (glass, paper and so on), a ceramic (alumina, aluminum nitride, zirconia and so on) substrate, a metal core (copper, CIC, aluminum and so on) substrate and so on.

The above-described conductive film is, for example, a metal (copper, chromium, nickel and so on) thin film, a metal (silver, lead, copper and so on) thick film and so on.

The through-hole which exists in the double- or single-sided printed wiring substrate is, for example, a plated through-hole such as a via hole and so on and a hole into which a part is inserted, and so on. Plating for the plated through-hole is, for example, electroless copper plating, electro-copper plating, gold plating and so on.

According to the manufacturing process of the present invention, the through-hole of the double- or single-sided printed wiring substrate is plugged with the photo-setting and thermosetting resin composition of the present invention. For example, plugging of the through-hole may be carried out by applying/charging the photo-setting and thermosetting resin composition of the present invention to/into the through-hole by mask printing using a polyester screen or stainless steel screen and so on, metal mask printing, roll coat printing and so on.

Next, the unset photo-setting and thermosetting resin composition plugged into the through-hole in such a manner as described above is photo-set. The conditions for carrying out photo-setting is not particularly limited, but can be selected properly. For example, the photo-setting can be carried out by irradiation with light having wavelength which initiates the photo-setting with the component (III) (specifically UV light of wavelength 200~400 nm) with irradiation doses of 0.5~10 J/cm$^2$ at temperatures of −20~80° C.

By such photo-setting, a set resin usually having the pencil hardness of F~4H can be obtained. If consideration is given to polishability described later, a set resin having the pencil hardness of F~2H is more preferable.

The photo-setting can be carried in liquid. For example, the photo-setting can be carried out by dipping the above-described plugged-through-hole double- or single-sided printed wiring substrate in liquid, irradiating with light from a light source placed in the liquid or outside the liquid. The photo-setting can be carried out by using a light-irradiating apparatus in liquid described in, for example, JP Patent Laid-Open Publication No. 9-6010 and JP Patent Laid-Open Publication No.10-29247.

The liquid is preferably that does not inhibit the setting reaction and does not dissolve the unset resin composition plugged into the through-hole. Specific examples of such liquid include water, alcohols (methanol, ethanol, isopropanol and so on), hydrocarbons (heptane, mineral spirits, liquid paraffin, xylene and so on), halogenated liquids[methylene chloride, trichloroethane, carbon tetrachloride, tetrachloroethylene, bromomethane, bromopropane, "Freon" [trademark for a line of fluorocarbon products from Du Pont, (Freon 113(2,4,6-trichlorotrifluoroethane and so on)], HCFC 225, xylenehexachloride and so on], polyhydric alcohols(ethylene glycol, ethylene glycol dimethylether and so on), fats and oils(turpentine oil, kerosine, silicone oil and so on), and liquid nitrogen and so on. The temperature of the liquid may be, for example, −20~30° C.

By carrying out the photo-setting in liquid, the temperature control can be carried out easily and occurrence of thermosetting as a side reaction can be suppressed. Since air bubbles which exist in the resin composition plugged into the through-hole rises to the surface of the substrate from the central region of the substrate by liquid pressure, these air bubbles can be removed at the subsequent process of surface polishing.

After the photo-setting has been accomplished, the surface of the substrate is polished. It is preferable that the polishing is carried out at least to parts in which a conductive film is covered with the photo-set resin. By doing this, the conductive film can be exposed. Further, it is preferable that the polishing is carried out until the surface of the conductor and the exposed surface of the photo-set resin are present in an identical horizontal plane (smooth flat surface). When copper plating is applied to form a circuit while they are not yet present in an identical horizontal plane (smooth flat surface), a hollow is formed in the substrate and hence solderability of parts lowers.

Examples of the polishing method are a mechanical polishing method (belt sander, buff polishing, sandblast, scrub polishing and so on).

After the surface of the double- or single-sided printed wiring substrate has been polished, (A) the above-described photo-set product is thermoset, a conductor circuit is formed and then the plugged-through-hole double- or single-sided printed wiring board of the present invention is obtained.

In thermosetting the photo-set product, the setting temperature may be, for example, 150~200° C. When the setting temperature is too low, the reaction in which epoxy rein takes part does not proceed sufficiently; and hence the heat-resistance and the humidity-resistance of the thermoset product lowers. On the contrary, when the secondary setting temperature is too high, the substrate itself suffers thermal damage.

The setting time may be, for example, 30~180 minutes. When the setting time is extremely short, the heat-resistance and the humidity-resistance of the set product are not sufficient, on the contrary, when the setting time is too long, working efficiency lowers.

Next, a conductor circuit is formed on the surface of the substrate. For example, the formation of the conductor circuit can be carried out by applying an etching resist to the surface of the substrate, then etching, and thereafter removing the etching resist.

Examples of the above-described etching resist processing are a dry laminate film (laminate) method in which the surface of the substrate is covered with a dry film, then the dry film is exposed and set through a pattern mask to form a resist; an electrodeposition method in which unnecessary region of a conductor foil has been previously covered with an organic resist, then a conductor pattern region is coated with a metal resist by electrodeposition, thereafter only the organic resist is removed, and so on.

Examples of an etchant include a ferric chloride etching solution, a cupric chloride etching solution, an alkaline etchant, hydrogen peroxide/sulfuric acid and so on.

These etchants can be properly selected according to the types of the above-described etching resist processing.

Removal of the etching resist can be carried out by, for example, spraying a resist removing solution such as aqueous solution of sodium hydroxide and so on to the surface of a panel from a spray nozzle and rinsing the resist.

In such a manner as described above, the plugged-through-hole double- or single-sided printed wiring substrate of the present invention can be obtained.

According to the present invention, various kinds of layers such as an insulating layer, a protective layer and so on are formed on the surface of the plugged-through-hole double- or single-sided printed wiring substrate, if necessary.

Examples of the materials for the insulating layer are a resin-coated copper foil (RCC), a layer insulating agent (an epoxy resin composition and so on), a prepreg and so on. Examples of the materials for the protective layer are a photosensitive solder mask and so on.

For example, the formation of the insulating layer and the protective layer can be made by coating the surface of the plugged-through-hole double- or single-sided printed wiring substrate with the insulating layer material or the protective layer material, thereafter subjecting to a usual method, for example, a press heating under vacuum method, a exposure-setting-developing method and so on.

In an alternative method for preparing the plugged-through-hole double- or single-sided printed wiring board of the present invention, after the surface of the above-described substrate has been polished, the process (B) described below may be carried out instead of the process (A.) That is to say, after the surface of the substrate of the above-described double- or single-sided printed wiring substrate has been polished, (B) a conductor circuit is formed on the surface of the substrate and then the afore-mentioned photo-set product is thermoset to obtain the plugged-through-hole double- or single-sided printed wiring board of the present invention.

The formation of the conductor circuit and thermosetting of the photo-set product may be carried out in the same manner as that of the process (A).

In the manufacturing process employing the process (B), various kinds of layers such as an insulating layer, a protective layer and so on are also formed on the surface of the plugged-through-hole double- or single-sided printed wiring substrate, if necessary.

Examples of the insulating layer material and the protective layer material are the same as those exemplified in the process (A). The formation of the insulating layer and the protective layer can be made in the same manner as that of the process (A).

Alternatively, in the above-described process (B), the surface of the plugged-through-hole double- or single-sided printed wiring substrate is coated with various kinds of layers such as an insulating layer, a protective layer and so on after the conductor circuit has been formed. Thereafter, the formation of the insulating layer and the protective layer (thermosetting) and the thermosetting of the photo-set product in the above-described process (B) can be carried out at the same time by, for example, a press heating under vacuum method and so on.

The plugged-through-hole double- or single-sided printed wiring board prepared in such a manner as described above can be used as a multi-layer printed wiring substrate (for example, each component layer of the multi-layer printed wiring board) as it is. That is to say, the plugged-through-hole multi-layer printed wiring substrate can be prepared in the entirely same manner as that of preparing the plugged-through-hole double- or single-sided printed wiring board described above.

Accordingly, the plugged-through-hole multi-layer printed wiring substrate of the present invention can be prepared by plugging the photo-setting and thermosetting resin composition of the present invention into the through-hole in the multi-layer printed substrate, photo-setting to form a photo-set product, polishing the surface of the substrate, (A) thermosetting said photo-set product and then form a conductor circuit, or (B) forming the conductor circuit and then thermosetting said photo-set product.

In the entirely same method as that for preparing the plugged-through-hole double- or single-sided printed wiring substrate, various kinds of layers such as an insulating layer, a protective layer and so on can be also formed on the surface of the plugged-through-hole multi-layer printed wiring substrate.

The above-described multi-layer printed wiring substrate for a material is, for example, that having a structure in which one or both sides of an insulating substrate are coated with a conductive film, and an internal wall of a through-hole is also coated with the conductive film.

The above-described insulating substrate and the conductive film are those exemplified in the afore-mentioned double- or single-sided printed wiring substrate.

The through-hole in the multi-layer printed wiring substrate are, for example, a via hole, a plated through-hole such as an interstitial via hole (IVH) and so on, and a hole into which a part is inserted and so on. Plating in the plated through-hole is, for example, electroless copper plating, electro-copper plating, gold plating and so on.

The term "multi-layer printed wiring substrate" herein used means all plate-like articles valuable for a material of a multi-layer printed wiring board. Accordingly, the multi-layer printed wiring substrate is, for example, the one having a structure in which one or both sides of the above-described insulating substrate are coated with a conductive film and having a through-hole; various kinds of component layers of the multi-layer printed wiring substrate; and a core material in a build-up method (hereinafter sometimes referred to as "build-up core material") and so on.

It is particularly preferable that the plugged-through-hole multi-layer printed wiring substrate such as a plugged-through-hole build-up core material and so on is prepared by plugging the photo-setting and thermosetting resin composition of the present invention into the through-hole, photo-setting to form a photo-set product, polishing the surface of the substrate, applying plating on the surface of the substrate, (A) thermosetting said photo-set product and then form a conductor circuit, or (B) forming the conductor circuit and then thermosetting said photo-set product.

For example, the above-described plating on the surface of the substrate can be carried out, by electroless plating, electroplating, deposition or sputtering on one or both sides of the surface of the substrate, or a combination of these plating methods. The thickness of plating is not specifically limited, but may be usually 10~50μ.

Various kinds of layers such as an insulating layer, a protective layer and so on can be formed on the surface of the plugged-through-hole build-up core material in the entirely same method as that for preparing the plugged-through-hole double- or single-sided printed wiring substrate described above.

Various kinds of plugged-through-hole multi-layer printed wiring boards can be prepared form the plugged-through-hole double- or single-sided printed wiring substrate of the present invention. For example, various kinds of component layers of the multi-layer printed wiring board are made by the above-described manufacturing method of the present invention. Next, each of these layers is stacked in desired order with a prepreg interposed between them from a laminate. A reference hole (a guide pin) is made in the laminate, through which a guide pin is inserted. Thereafter, the laminate as a whole is heated under pressure to give the plugged-through-hole multi-layer printed wiring board.

Another method of preparing the plugged-through-hole multi-layer printed wiring board is described below: A build-up core material is made by, for example, the above-described manufacturing method. Each process of (i) formation of plating resist, (ii) removal of the plating resist after plating of metal and (iii) coating with an insulating resin film is repeated a desired number of times on the surface of the core material to obtain the plugged-through-hole multi-layer printed wiring board having an insulating layer and a protective layer laminated alternatively.

A semiconductor packaging substrate on which the above-described plugged-through-hole double- or single-sided printed wiring board or plugged-through-hole multi-layer printed wiring board is mounted can be made by a conventional method.

EXAMPLE

The present invention will be more clearly understood from the following examples with reference to the accompanying drawings:

[Preparation of the Photo-Setting and Thermosetting Resin Composition]

Examples 1~9 and Comparative Examples 1~4

Each of the components shown in Table 27 or 28 was added sequentially and mixed under stirring to form a mixture. Then, the mixture was dispersed homogeneously by a triple roll mill to form a dispersion. The homogeneous dispersion thus obtained was deaerated under vacuum to prepare the photo-setting and thermosetting resin composition (Examples 1~9 and Comparative Examples 1~4). Each of the components and amount used (kg) are shown in Tables 27 and 28.

TABLE 27

| ingredient (kg) | Example | | | | | | |
|---|---|---|---|---|---|---|---|
| | 1 | 2 | 3 | 4 | 5 | 6 | 7 |
| ingredient (I) | | | | | | | |
| adduct of phenolic novolak-type epoxy resin with 75% acrylic acid | — | — | 100 | 100 | — | 100 | — |
| adduct of cresol novolak-type epoxy resin with 50% acrylic acid | — | — | — | — | 100 | — | — |
| adduct of trisphenylmethane-type epoxy resin with 33% acrylic acid | — | — | — | — | — | — | 100 |
| adduct of bisphenol A novolak-type epoxy resin with 60% methacrylic acid | — | — | — | — | — | — | — |
| adduct of dicyclopentadiene phenol-type epoxy resin with 40% methacrylic acid | 100 | — | — | — | — | — | — |
| adduct of phenolic novolak-type epoxy resin with 50% crotonic acid | — | 100 | — | — | — | — | — |
| ingredient (II) | | | | | | | |
| isoboronyl acrylate | — | — | 25 | 25 | — | 25 | 25 |
| dicyclopentanyl methacrylate | 30 | 30 | — | — | 20 | — | — |
| hydroxypivalic acid neopentyl glycol diacrylate | — | — | — | — | — | — | 20 |
| tricyclodecane dimetanol acrylate | — | 100 | 100 | 100 | — | 100 | — |
| trimethylolpropane triacrylate | 70 | — | — | — | 50 | — | — |
| dipentaerythritol hexacrylate | 80 | 80 | 20 | 20 | 80 | 20 | 100 |
| ingredient (III) | | | | | | | |
| 2-metyl-1[4-(methythio)phenyl]-2-morpholinopropan-1-one | 10 | 10 | 10 | 10 | — | — | — |
| 2,4,6-trimethylbenzoyl diphenylphosphine oxide | — | — | — | — | 8 | — | 8 |
| diethylthioxanthone | 1 | 1 | 1 | 1 | — | — | — |
| 2-benzyl-2-dimethylamino-1-(4-morpholinophenyl)butan-1-one | — | — | — | — | — | 15 | — |
| bis (2,4,6-trimethylbenzoyl)-phenylphosphine oxide | — | — | — | — | — | — | — |
| ingredient (IV) | | | | | | | |
| bisphenol A-type epoxy resin (*1) | 80 | 40 | 80 | 80 | — | 80 | — |
| bisphenol F-type epoxy resin (*2) | — | 40 | — | — | 80 | — | — |
| N,N,O-tris (glycidyl)-p-aminophenol | — | — | — | — | — | — | 60 |
| bisphenol AD-type epoxy resin | 20 | 20 | — | — | — | — | — |
| ingredient (V) | | | | | | | |
| dicyandiamide | 10 | 10 | — | — | — | — | 10 |
| 2,4-diamino-6-(2'-methylimidazolyl-(1'))-ethyl-s-triazine | — | — | 6 | 6 | 6 | 6 | — |
| adduct of phenolic novolak-type epoxy resin with 100% acrylic acid | — | — | — | — | — | — | — |
| cresol novolak-type epoxy resin | — | — | — | — | — | — | — |
| silica | 250 | 250 | 250 | 250 | — | 250 | 200 |
| colloidal silica | — | — | 6 | 6 | — | 6 | 6 |
| surface treated colloidal silica | 6 | 6 | — | — | 6 | — | — |
| calcium carbonate | — | — | — | — | 300 | — | — |
| aluminum hydroxide | — | — | — | — | — | — | 100 |
| feldspar powder | — | — | — | — | — | — | — |
| polydimethylsiloxane | 3 | 3 | 3 | 3 | 3 | 3 | 3 |

TABLE 28

| ingredient (kg) | Example | | Comparative Example | | | |
|---|---|---|---|---|---|---|
| | 8 | 9 | 1 | 2 | 3 | 4 |
| ingredient (I) | | | | | | |
| adduct of phenolic novolak-type epoxy resin with 75% acrylic acid | — | 100 | — | 100 | 100 | — |
| adduct of cresol novolak-type epoxy resin with 50% acrylic acid | — | — | — | — | — | — |

TABLE 28-continued

|  | Example | | Comparative Example | | | |
|---|---|---|---|---|---|---|
| ingredient (kg) | 8 | 9 | 1 | 2 | 3 | 4 |
| adduct of trisphenylmethane-type epoxy resin with 33% acrylic acid | — | — | — | — | — | — |
| adduct of bisphenol A novolak-type epoxy resin with 60% methacrylic acid | 100 | — | — | — | — | — |
| adduct of dicyclopentadiene phenol-type epoxy resin with 40% methacrylic acid | — | — | — | — | — | — |
| adduct of phenolic novolak-type epoxy resin with 50% crotonic acid | — | — | — | — | — | — |
| Ingredient (II) | | | | | | |
| isoboronyl acrylate | 30 | 25 | 25 | 25 | 25 | — |
| dicyclopentanyl methacrylate | — | — | — | — | — | — |
| hydroxypivalic acid neopentyl glycol diacrylate | — | — | — | — | — | 50 |
| tricyclodecane dimetanol acrylate | 100 | 100 | 100 | 100 | 100 | 100 |
| trimethylolpropane thacrylate | — | — | — | — | — | — |
| dipentaerythritol hexacrylate | 100 | 20 | 20 | 20 | 20 | 100 |
| ingredient (III) | | | | | | |
| 2-metyl-1[4-(methythio)phenyl]-2-morpholinopropan-1-one | 10 | — | 10 | 10 | 10 | 10 |
| 2,4,6-trimethylbenzoyl diphenylphosphine oxide | — | — | — | — | — | — |
| diethylthioxanthone | 1 | — | 1 | 1 | 1 | 1 |
| 2-benzyl-2-dimethylamino-1-(4-morpholinophenyl)butan-1-one | — | — | — | — | — | — |
| bis (2,4,6-trimethylbenzoyl)-phenylphosphine oxide | — | 6 | — | — | — | — |
| ingredient (IV) | | | | | | |
| bisphenol A-type epoxy resin (*1) | 100 | 80 | 80 | — | — | 80 |
| bisphenol F-type epoxy resin (*2) | — | — | — | — | — | — |
| N,N,O-tris (glycidyl)-p-aminophenol | — | — | — | — | — | — |
| bisphenol AD-type epoxy resin | — | — | — | — | — | — |
| ingredient (V) | | | | | | |
| dicyandiamide | — | — | — | — | — | — |
| 2,4-diamino-6-(2'-methylimidazolyl-(1'))-ethyl-s-triazine | 8 | 6 | 6 | 6 | 6 | 6 |
| adduct of phenolic novolak-type epoxy resin with 100% acrylic acid | — | — | 100 | — | — | — |
| cresol novolak-type epoxy resin | — | — | — | — | 80 | — |
| silica | — | 250 | 250 | 250 | 250 | 250 |
| colloidal silica | 6 | 6 | 6 | 6 | 6 | 6 |
| surface treated colloidal silica | — | — | — | — | — | — |
| calcium carbonate | — | — | — | — | — | — |
| aluminum hydroxide | — | — | — | — | — | — |
| feldspar powder | 250 | — | — | — | — | — |
| polydimethylsiloxane | 3 | 3 | 3 | 3 | 3 | 3 |

(*1) and (*2) in Tables 27 and 28 are explained below:

*1: a mixture of bisphenol A-type epoxy resins illustrated by formula(3) wherein n is 0 (86% by weight) and n is 1 (14% by weight), having average molecular weight of 380.

*2: a mixture of bisphenol F-type epoxy resins illustrated by formula (4) wherein n is 0 (60% by weight) and n is 1 (40% by weight).

(Preparation of a Plugged-Through-Hole Double-Sided Printed Wiring Board Coated With a Solder Mask)

Examples 10~12

A laminate [total thickness: 3.2 mm, copper film thickness: 25μ, through-hole diameter: 0.3 mm] which was prepared by covering both sides and a through-hole [FIG. 1, A (3)] of a glass-cloth reinforced laminate [FIG. 1, A. (1)] with copper was used as a both sides printed wiring substrate. The photo-setting and thermosetting resin composition (Examples 1~3) was printed on the substrate by a screen printing method using a 200-mesh stainless steel screen and charged and plugged into the through-hole (FIG. 1, B, (4)]. Ease of charging and plugging into the through-hole (through-hole-chargeability and pluggability) is shown in Table 29.

Next, the substrate was photo-set by using an exposing apparatus in liquid [manufactured by NODA SCREEN CO. LTD.] to form a photo-set product. "Freon" (trademark for a line of fluorocarbon products from Du Pont] was used as the liquid. Exposure was 8 J/cm$^2$ and liquid temperature was 20° C. After the above-described photo-setting, the pencil hardness of the photo-set product was measured. Results obtained are shown in Table 29.

Thereafter, both sides of the substrate were polished two times by a 400 # ceramic buff and then polished two times by a 600 # ceramic buff [FIG. 1, C]. Polishability is shown in Table 29.

Thereafter, conductive patterns were formed on both sides of the substrate as described below: First, an etching resist was formed by a dry film (laminate) method using a dry film.

That is to say, dry films were put on both sides of the substrate, on which negative-type films (pattern mask) were superimposed, and then exposed and photo-set by an ultra-high pressure mercury lamp.

Next, carrier films of the dry films were removed to expose the resist. The exposed surfaces were sprayed with developing solution (1% sodium carbonate solution) from a spray nozzle to develop, and then washed to form resist patterns [FIG. 1, D, (5)].

Next, etching was carried out. That is to say, a ferric chloride solution (36% by weight) was sprayed on both sides of the substrate to dissolve and remove unnecessary copper foils. After the above-described etching has been completed, 3% sodium hydroxide solution was sprayed from a spray nozzle to wash away the etching resist while swelling.

After conductive patterns have been formed in such a manner as described above, conductive patterns were coated with solder masks [FIG. 1E, (6)] which were then subjected to secondary setting. That is to say, first UV-setting and thermosetting acrylate/epoxy mixed resins were printed on both sides on which were formed the conductive patterns by a squeegee (squeegee hardness: 75) through a 150-mesh "Tetoron" (trademark for polyester synthetic fiber manufactured by TOYO RAYON CO., LTD.) screen.

Next, after pre-baking has been carried out at temperatures of 75~80° C. in a warm air drying oven, both of the sides were exposed (300 mj/cm$^2$) and set. Development was carried out by using 1% solution of sodium carbonate (30° C., 2.5 kg/cm$^2$). Thereafter, heating was carried out at 150° C. for 30 minutes to carry out thermosetting.

The plugged-through-hole both sides-printed wiring boards obtained in such a manner as described above (Examples 10~12) were checked for solder-resistance as described below. That is to say, the plugged-through-hole double-sided printed wiring boards were dipped in melted solder of 260° C. for 60 seconds, and the presence or absence of a crack, a blister and a peeling was checked. Results obtained were shown in Table 29.

Further, the shape of the exposed area of the set resin charged and plugged into the through-hole was estimated visually. Results obtained were shown in Table 29.

(Preparation of Plugged-Through-Hole Build-Up Core Material)

Example 13~15

Figure 2:
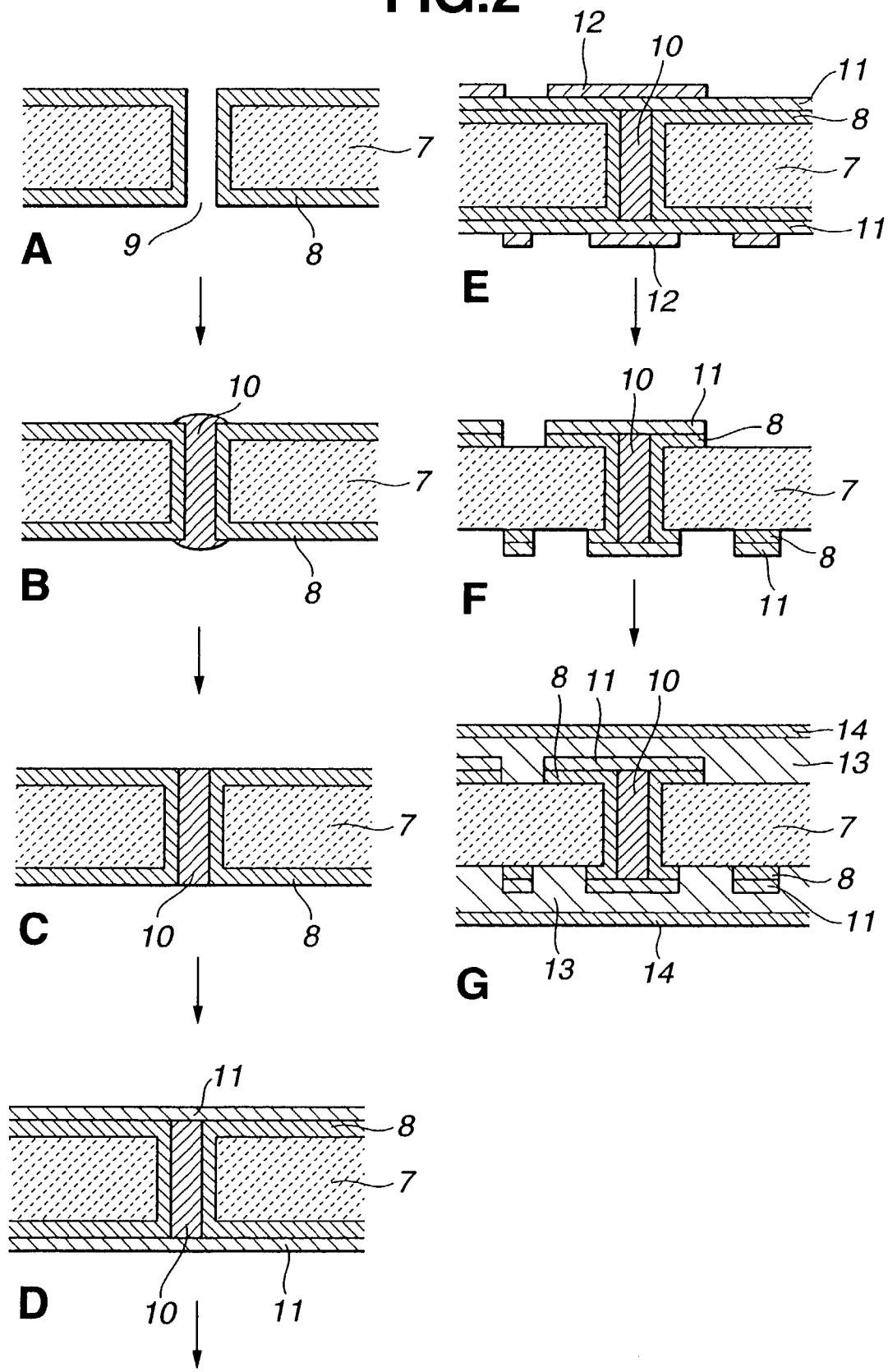
FIG. 2 is a flow diagram of manufacturing process of a plugged-through-hole build-up core material according to the present invention and shows cross sectional views of the substrate and the build-up core material.
Figure 3:
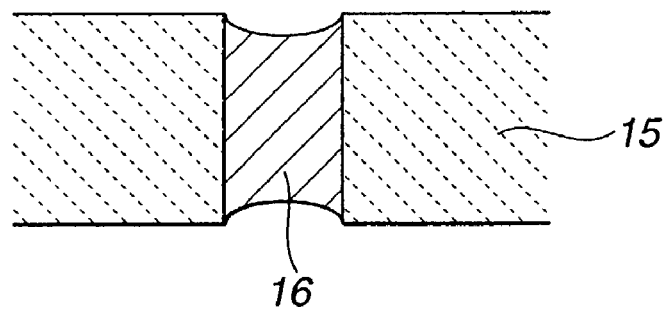
FIG. 3 is a cross sectional view of an insulating substrate a through-hole in which is plugged with a conventional thermosetting resin composition and shows a state that after thermosetting has been completed, the liquid level of the thermosetting resin composition plugged into the through-hole lowers and depressions are formed.
Figure 4:
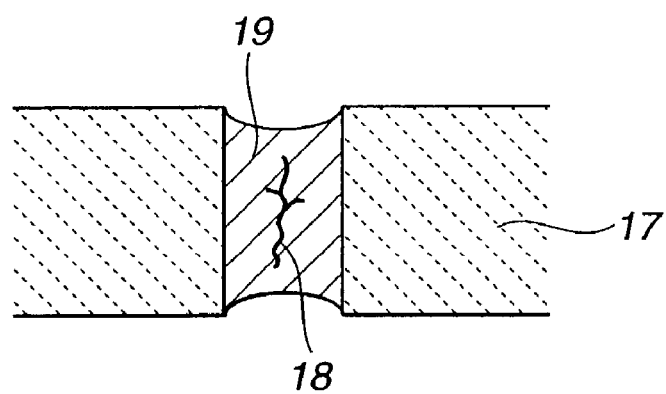
FIG. 4 is a cross sectional view of an insulating substrate a through-hole in which is plugged with a conventional thermosetting resin composition and shows a state that after thermosetting has been completed, cracks occur in the set resin plugged in the through-hole.

A laminate [total thickness: 1.6 mm, copper film thickness: 25μ, through-hole diameter: 0.3 mm] which was prepared by covering both sides and a through-hole [FIG. 2, A (9)] of a glass-cloth reinforced laminate [FIG. 2, A. (7)] with copper was used as a multi-layer printed wiring substrate. The photosetting and thermosetting resin composition (Examples 4~6) was printed on the substrate by screen printing method using a 250-mesh polyester screen and charged and plugged into the through-hole (FIG. 2, B, (10)]. Ease of charging and plugging into the through-hole (through-hole-chargeability and pluggability) is shown in Table 29.

Next, the substrate was photo-set by using an exposing apparatus in liquid [manufactured by NODA SCREEN CO. LTD.] to form a photo-set product. "Freon" (trademark for a line of fluorocarbon products from Du Pont] was use as the liquid. Exposure was 2 J/cm$^2$ and liquid temperature was 20° C. After the above-described photo-setting, the pencil hardness of the photo-set product was measured. Results obtained are shown in Table 29.

Thereafter, both sides of the substrate were first polished two times by a 400 # belt sander and then polished four times by a 600 # buff [FIG. 2, C]. Such polishability is shown in Table 29.

Thereafter, the entire surfaces of the substrate were copper-plated in such a manner as described below: First, the entire surfaces of the substrate were electroless plated with copper by a conventional method (palladium was used as a copper deposition catalyst) and then electroplated to obtain a copper plate layer 20μ in thickness [FIG. 2D, (11)].

Thereafter, etching resists were formed on both sides of the substrate as described below: Electro-deposit films (anionic polymer film 10μ in film thickness) were formed on both sides of the substrate by a photo FD resist electrodeposition method. Thereafter, negative-type films (pattern mask) were superimposed and exposed and set by an ultra-high pressure mercury lamp. Next, resist patterns [FIG. 2E, (12)] were formed by spraying a developing solution (1% sodium carbonate solution) on both sides of the substrate from a spry nozzle to develop, removing the films, and washing the substrate.

Next, etching was carried out. That is to say, ferric chloride solutions (36% by weight) were sprayed on both sides of the substrate to dissolve and remove unnecessary metal film s (copper-clad layer and copper plate layer). After the above-described etching has been completed, a 3% sodium hydroxide solution was sprayed from a spray nozzle to wash away the etching resist while swelling [FIG. 2, F].

After conductive patterns have been formed in such a manner as described above, RCC were laminated on both sides of the substrate a RCC-laminated substrate. In FIG. G in FIG. 2, (13) are resin layers of RCC and (14) are copper foils of RCC. Then, the RCC-laminated substrate was heated at a temperature of 180° C. for 30 by a vacuum press to carry out simultaneously formation of RCC insulating layers and thermosetting of the photo-set product, and a build-up core material which was a plugged-through-hole multi-layer printed wiring substrate was prepared (Examples 13~15).

The plugged-through-hole build-up core material obtained was checked for solder-resistance in the same manner as those of Examples 13~15. Further, the shape of the exposed area of the set resin charged and plugged into the through-hole was estimated visually in the same manner as those of Examples 13~15. Results obtained are shown in Table 29.

Comparative Examples 5~8

Plugged-through-hole build-up materials (Comparative Examples 5~8) were prepared in the same manner as used in Examples 4~6 except that through-hole plugging materials used in Comparative Examples 1~4 were used instead of those in Examples 4~6.

Similar to Examples 13~15, the chargeability and applicability of the through-hole plugging material, and the pencil hardness, polishability, solder-resistance of the photo-set product, and the shape of the surface of plugged-through-hole are shown in Table 30.

(Preparation of a Plugged-IVH-Multi-Layer Printed Wiring Substrate)

Examples 16~18

As a double-sided printed wiring substrate was used a laminate [total thickness: 0.8 mm, copper film thickness: 25μ, through-hole diameter: 0.3 mm] which was prepared by covering both sides of the substrate and the inner wall of IVH with copper. The photo-setting and thermosetting resin composition (each of Examples 7~9) was printed by a screen printing method using a 250-mesh polyester screen to charge and plug the IVH. Ease of such charging and plugging of through-hole (through-hole-chargeability and pluggability) is shown in Tables 29 and 30.

Next, the substrate was photo-set by using an exposing apparatus in liquid [manufactured by NODA SCREEN CO. LTD.] to form a photo-set product. "Freon" (trademark for a line of fluorocarbon products from Du Pont] was used as the liquid. Exposure was 1 J/cm$^2$ and liquid temperature was 20° C. After the above-described photo-setting, the pencil hardness of the photo-set product was measured. Results obtained are shown in Tables 29 and 30.

Thereafter, both sides of the substrate were first polished two times by a 400 # ceramic buff and then polished four times by a 600 # buff. Polishability is shown in Tables 29 and 30.

Thereafter, conductive patterns were formed on both sides of the substrate as described below: First, etching resists were formed by a dry film (laminate) method using a dry film. That is to say, dry films were put on both sides of the substrate, on which negative-type films (pattern masks) were superimposed, and then exposed and photo-set by an ultra-high pressure mercury lamp to form a photo-set product.

Next, carrier films of the dry films were removed to expose the resist. The surfaces of the exposed resists were sprayed with developing solution (1% sodium carbonate solution) from a spry nozzle to develop, and then washed.

Next, etching was carried out. That is to say, ferric chloride solutions (36% by weight) were sprayed on both sides of the substrate to dissolve and remove unnecessary copper foils. After the above-described etching has been completed, 3% sodium hydroxide solution was sprayed from a spray nozzle to wash away the etching resist while swelling.

After conductive patterns have been formed in such a manner as described above, resin-impregnated prepregs were laminated on both sides of the substrate. Heating was carried out at a temperature of 190° C. for 90 minutes by a vacuum press to perform simultaneously the formation of a prepreg insulating layer and thermosetting of the photo-set product, and a plugged-IVH-multi-layer printed wiring substrates were prepared (each of Examples 16~18.)

The plugged-IVH-multi-layer printed wiring substrates thus obtained were checked for solder-resistance in the same manners as those of Examples 13~15. Further, the shape of the exposed area of the set resin charged and plugged into the IVH was estimated visually in the same manner as those of Examples 13~15. Results obtained are shown in Tables 29 30.

TABLE 29

| | Example | | | | | | |
|---|---|---|---|---|---|---|---|
| | 10 | 11 | 12 | 13 | 14 | 15 | 16 |
| through-hole plugging material used | Example 1 | Example 2 | Example 3 | Example 4 | Example 5 | Example 6 | Example 7 |
| pluggability of through-hole plugging material (chargeability and applicability) | ease | ease | ease | ease | ease | ease | ease |
| pencil hardness of photoset product solder-resistance | 2H | 2H | 2H | 2H | 2H | 2H | H |
| polishability | good | good | good | good | good | good | good |
| crack | nil | nil | nil | nil | nil | nil | nil |
| blister | nil | nil | nil | nil | nil | nil | nil |
| peeling | nil | nil | nil | nil | nil | nil | nil |
| shape of the surface of a plugged-through-hole | flat | flat | flat | flat | flat | flat | flat |

TABLE 30

| | Example | | Comparative Example | | | |
|---|---|---|---|---|---|---|
| | 17 | 18 | 5 | 6 | 7 | 8 |
| through-hole plugging material used | Example 8 | Example 9 | Comparative Example 1 | Comparative Example 2 | Comparative Example 3 | Comparative Example 4 |
| pluggability of through-hole plugging material (chargeability and applicability) | ease | ease | ease | ease | difficult | difficult |
| pencil hardness of photoset product solder-resistance | H | H | 6H | 2H | 2H | inferior to B |
| polishability | good | good | bad | good | good | bad |
| crack | nil | nil | exist | exist | nil | nil |
| blister | nil | nil | nil | nil | nil | nil |
| peeling | nil | nil | nil | nil | nil | nil |
| shape of the surface of a plugged-through-hole | flat | flat | flat | flat | hollow | flat |

In the item of "polishability" of Tables 29 and 30, "good" means that polishing was easily carried out without causing areas that remain unpolished.

In the item of "polishability" of Tables 29 and 30, "bad" means that polishing was hard to carry out with areas that remain unpolished.

Figure 5:
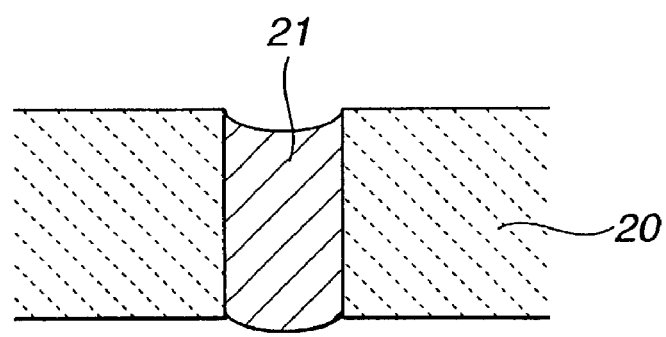
FIG. 5 is a cross sectional view of an insulating substrate a through-hole in which is plugged with a conventional photo-setting and thermosetting resin composition containing solid epoxy resin and shows a state that after thermosetting has been completed, the set resin plugged into the through-hole droops greatly.

In the item of "shape of the surface of a plugged-through-hole" of Tables 29 and 30, "smooth" means that there is neither blister nor recess in the exposed area of the set resin plugged into through-hole and the whole surface of the plugged-through-hole both sides-printed wiring board was smooth; "hollow" means that the exposed area of the set resin plugged into through-hole dented greatly, because the photo-set resin plugged into the through-hole flowed out of the through-hole (FIG. 5).

It is evident from the above-described Tables 29 and 30 that when the photo-setting and thermosetting resin composition of the present invention (each of Examples 1~9) is used as a through-hole plugging material, plugging of through-hole (charging and application) is easy to carry out, and the polishability is good because a photo set product having the proper pencil hardness is obtained.

The plugged-through-hole printed wiring (substrate) board (each of Examples 10~18) prepared from the photo-setting and thermosetting resin composition of the present invention is excellent in solder-resistance and does not cause cracks, blisters, peelings and so on. The area on the surface of the resin composition plugged into the through-hole is smooth.

On the other hand, when Comparative Example 3[resin composition containing a solid epoxy resin instead of component (IV)] or Comparative Example 4 [resin composition containing no component (I)] is used as a through-hole plugging material, the viscosity of the setting resin composition is excessively high, and hence plugging of the through-hole (charging and application) is difficult to carry out.

Further, when Comparative Example 1 [resin composition containing an adduct of epoxy resin with 100% unsaturated aliphatic acid instead of component (I)] is used as a through-hole plugging material, the photo-set product becomes hard excessively, a subsequent surface polishing is difficult. Or when using Comparative Example 4, an unset portion remains in the photo-set product, and stickiness occurs on the surface, and hence a subsequent surface polishing is also difficult.

The plugged-through-hole build-up core material (each of Comparative Examples 5 and 6) prepared by Comparative Example 1 or 2 [resin composition containing no component (WV)]causes disadvantages such as cracks and so on. Further, in the case of the plugged-through-hole build-up core material (Comparative Example 7) prepared by Comparative Example 3, the resin plugged into the through-hole flows out of the through-hole to the surface of the substrate. Consequently, a large hollow is formed on the surface of the plugged hollow.

The photo-setting and thermosetting resin composition of the present invention can be easily charged and plugged into a through-hole, does not drip down, and can be effectively photo-set and thermoset. The photo-set product prepared from the photo-setting and thermosetting resin composition of the present invention can be easily polished.

The plugged-through-hole printed wiring (substrate) board of the present invention does not cause defects such as cracks, blisters, peelings and so on, does not corrode a metal part, and is excellent in solder-resistance. Accordingly, if the plugged-through-hole printed wiring (substrate) board of the present invention is used, the reliability and life of an appliance can be increased because short circuit and poor electrical connection do not occur.

What is claim:

1. A photo-setting and thermosetting resin composition for preparing a plugged-through-hole printed wiring board or a plugged-through-hole multi layered printed wiring board consisting essentially of:
   - (I) 100 parts by weight of an adduct of an epoxy resin with an unsaturated aliphatic acid, the unsaturated aliphatic acid being added to 40-60% of epoxy groups in the epoxy resin,
   - (II) 100 to 300 parts by weight of (meth)acrylates,
   - (III) 1 to 50 parts by weight of a photocrosslinking agent,
   - (IV) 50 to 200 parts by weight of a liquid epoxy resin, and
   - (V) 1 to 50 parts by weight of a latent curing agent.

* * * * *